United States Patent
Patel et al.

(10) Patent No.: US 6,900,991 B2
(45) Date of Patent: May 31, 2005

(54) ELECTRONIC ASSEMBLY WITH SANDWICHED CAPACITORS AND METHODS OF MANUFACTURE

(75) Inventors: Priyavadan R. Patel, Chandler, AZ (US); Chee-Yee Chung, Chandler, AZ (US); David G. Figueroa, Mesa, AZ (US); Robert L. Sankman, Phoenix, AZ (US); Yuan-Liang Li, Chandler, AZ (US); Hong Xie, Phoenix, AZ (US); William P. Pinello, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 151 days.

(21) Appl. No.: 10/006,292

(22) Filed: Dec. 3, 2001

(65) Prior Publication Data

US 2003/0102555 A1 Jun. 5, 2003

(51) Int. Cl.[7] .................................................. H05K 7/06
(52) U.S. Cl. ......................... 361/782; 361/783; 257/724
(58) Field of Search ................................. 361/737, 738, 361/760, 763, 766, 780, 782, 783, 794, 306.2; 257/691, 724, 777

(56) References Cited

U.S. PATENT DOCUMENTS

| | | | | |
|---|---|---|---|---|
| 4,879,631 A | * | 11/1989 | Johnson et al. | 361/684 |
| 4,882,656 A | * | 11/1989 | Menzies et al. | 361/734 |
| 5,010,447 A | * | 4/1991 | Wallace | 361/782 |
| 5,272,590 A | * | 12/1993 | Hernandez | 361/306.2 |
| 5,504,373 A | * | 4/1996 | Oh et al. | 257/734 |
| 5,929,646 A | * | 7/1999 | Patel et al. | 324/754 |
| 5,996,880 A | * | 12/1999 | Chu et al. | 228/180.21 |
| 6,040,983 A | * | 3/2000 | Baudouin et al. | 361/760 |
| 6,043,987 A | * | 3/2000 | Goodwin et al. | 361/763 |
| 6,147,876 A | * | 11/2000 | Yamaguchi et al. | 361/766 |
| 6,178,082 B1 | * | 1/2001 | Farooq et al. | 361/303 |
| 6,252,760 B1 | * | 6/2001 | Sen | 361/306.3 |
| 6,300,677 B1 | * | 10/2001 | Salem | 257/691 |
| 6,316,828 B1 | * | 11/2001 | Tao et al. | 257/723 |
| 6,320,249 B1 | * | 11/2001 | Yoon | 257/678 |
| 6,373,714 B1 | * | 4/2002 | Kudoh et al. | 361/760 |
| 6,404,649 B1 | * | 6/2002 | Drake et al. | 361/782 |
| 6,459,561 B1 | * | 10/2002 | Galvagni et al. | 361/306.3 |
| 6,556,420 B1 | * | 4/2003 | Naito et al. | 361/306.1 |
| 2002/0071258 A1 | * | 6/2002 | Mosley | 361/782 |

* cited by examiner

*Primary Examiner*—John B. Vigushin
(74) *Attorney, Agent, or Firm*—Schwegman, Lundberg, Woessner & Kluth, P.A.

(57) ABSTRACT

To provide high-speed, low inductance capacitive decoupling, an integrated circuit (IC) package includes capacitors positioned within the mounting region between a die and an IC package substrate. A variety of types and sizes of capacitors and substrates can be employed in a variety of geometrical arrangements. In some embodiments, capacitors are sandwiched between die terminals or bumps and the substrate conductors or pads, while in other embodiments, capacitors are positioned between bar-type conductors on the surface of the IC package substrate. Methods of fabrication, as well as application of the package to an electronic assembly and to an electronic system, are also described.

42 Claims, 16 Drawing Sheets

(A)

904 CONT'D

- THE CONDUCTORS CAN BE OF ANY SUITABLE TYPE, SUCH AS SURFACE TRACES, PADS, OR BARS

- THE ONE OR MORE CAPACITORS AND/OR CAPACITOR ASSEMBLIES ARE ARRANGED SUCH THAT CERTAIN TERMINALS OF THE FIRST POLARITY TYPE CONTACT THE FIRST SET OF CONDUCTORS, AND CERTAIN TERMINALS OF THE SECOND POLARITY TYPE CONTACT THE SECOND SET OF CONDUCTORS

- IF THE IC PACKAGE SUBSTRATE SURFACE [ALTERNATIVE EMBODIMENT: IC SURFACE] HAS CONDUCTIVE BARS, ONE OR MORE OF THE CAPACITORS AND/OR CAPACITOR ASSEMBLIES IS POSITIONED BETWEEN ADJACENT ONES OF THE BARS

906

SECURE THE CAPACITORS AND/OR CAPACITOR ASSEMBLIES TO THE SUBSTRATE SURFACE [ALTERNATIVE EMBODIMENT: TO THE IC SURFACE] USING A SUITABLE MECHANISM

- E.G., APPLY A FILL OR ADHESIVE MATERIAL TO THE CAPACITORS AND/OR CAPACITOR ASSEMBLIES, AND/OR OPENINGS BETWEEN THE CAPACITORS AND/OR CAPACITOR ASSEMBLIES; USE SPACERS OR CLAMPS; ETC.

908

POSITION AND MOUNT AN IC ON THE MOUNTING REGION, E.G. USING SOLDER REFLOW

- ELECTRICALLY COUPLE THE IC TERMINALS TO CORRESPONDING TERMINALS OF THE ONE OR MORE CAPACITORS AND/OR CAPACITOR ASSEMBLIES, AND OPTIONALLY TO CONDUCTORS ON THE SUBSTRATE (B)

ELECTRONIC ASSEMBLY WITH SANDWICHED CAPACITORS AND METHODS OF MANUFACTURE

RELATED APPLICATION

The present application is related to the following application which is assigned to the same assignee as the present application and which was filed on even date herewith:

Ser. No. 10/006,188, entitled "Capacitor Having Separate Terminals on Three or More Sides and Methods of Fabrication".

TECHNICAL FIELD

The inventive subject matter relates generally to electronics packaging. More particularly, the inventive subject matter relates to an electronic assembly that includes an integrated circuit (IC) package having a decoupling capacitance situated between a high performance IC and an IC package substrate for reducing inductance and for providing improved power delivery, and to manufacturing methods related thereto.

BACKGROUND INFORMATION

Integrated circuits (ICs) are typically assembled into packages by physically and electrically coupling them to a substrate made of organic or ceramic material. One or more ICs or IC packages can be physically and electrically coupled to a substrate such as a printed circuit board (PCB) or card to form an "electronic assembly". The "electronic assembly" can be part of an "electronic system". An "electronic system" is broadly defined herein as any product comprising an "electronic assembly".

Examples of electronic systems include computers (e.g., desktops, laptops, hand-helds, servers, Web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

In the field of electronic systems there is an incessant competitive pressure among manufacturers to drive the performance of their equipment up while maintaining high yield and reliability. This is particularly true regarding the packaging of ICs on substrates, where each new generation of packaging must provide increased performance, particularly in terms of an increased number of components and higher clock frequencies, while generally being smaller or more compact in size.

An IC substrate may comprise a number of insulated metal layers selectively patterned to provide metal interconnect lines (referred to herein as "traces"), and one or more electronic components mounted on one or more surfaces of the substrate. The electronic component or components are functionally connected to other elements of an electronic system through a hierarchy of electrically conductive paths that include the substrate traces. The substrate traces typically carry signals that are transmitted between the electronic components, such as ICs, of the system.

One of the conventional methods for mounting an IC on a substrate is called "controlled collapse chip connect" (C4). In fabricating a C4 package, the electrically conductive terminals (generally called "bumps") of an IC component are soldered directly to corresponding terminals (generally called "pads") on the surface of the substrate using reflowable solder balls. The C4 process is widely used because of its robustness and simplicity.

As the internal circuitry of high performance ICs, such as processors, operates at higher and higher clock frequencies, noise in the power and ground lines increasingly reaches an unacceptable level. This noise can arise due to inductive and capacitive parasitics, for example, as is well known. To reduce such noise, capacitors known as decoupling or by-pass capacitors are often used to provide a stable signal or stable supply of power to the circuitry.

As electronic devices continue to advance, there is an increasing need for higher levels of capacitance at reduced inductance levels for decoupling, power dampening, and supplying charge. In addition, there is a need for capacitance solutions that do not interfere with package connectors of various types, and which do not limit the industry to certain device sizes and packing densities. Accordingly, there is a need in the art for alternative capacitance solutions in the fabrication and operation of electronic devices and their packages.

For the reasons stated above, and for other reasons stated below which will become apparent to those skilled in the art upon reading and understanding the present specification, there is a significant need in the art for methods and structures for packaging a high performance IC on a substrate that provide decreased inductance levels, and increased power delivery and signal integrity.

BRIEF DESCRIPTION OF THE DRAWINGS

FIGS. 20, 21, 22, 23, 24, and 25 illustrate cross-sectional representations illustrating stages of fabricating an IC package comprising sandwiched capacitors, in accordance with an embodiment of the invention, in which:

FIG. 20 illustrates fabricating a capacitor assembly by arranging a first layer of discrete capacitors on a conductive layer;

FIG. 21 illustrates fabricating additional layers of discrete capacitors;

FIG. 22 illustrates segmenting a stack of capacitor assemblies into a capacitor group;

FIG. 23 illustrates mounting capacitor groups on an IC package substrate;

FIG. 24 illustrates filling spaces with a dielectric;

FIG. 25 illustrates mounting a die on a capacitor layer of an IC package substrate;

FIGS. 28A, 28B, and 28C together illustrate a flow diagram of various methods of fabricating electronic assemblies, and/or constituents thereof, utilizing sandwiched capacitors, in accordance with embodiments of the invention.

DETAILED DESCRIPTION

Figure 1:
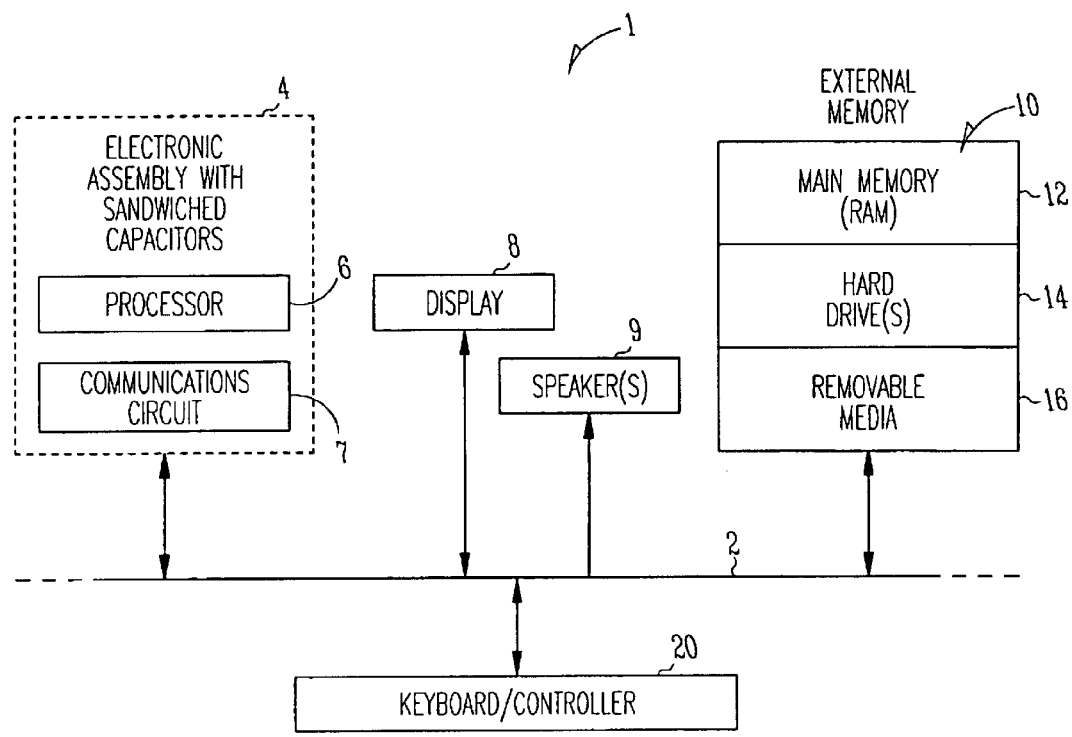
FIG. 1 is a block diagram of an electronic system incorporating at least one electronic assembly with sandwiched capacitors in accordance with an embodiment of the invention.

In the following detailed description of embodiments of the inventive subject matter, reference is made to the accompanying drawings which form a part hereof, and in which is shown by way of illustration specific preferred embodiments in which the inventive subject matter may be practiced. These embodiments are described in sufficient detail to enable those skilled in the art to practice the inventive subject matter, and it is to be understood that other embodiments may be utilized and that structural, mechanical, compositional, and electrical changes may be made without departing from the spirit and scope of the inventive subject matter. The following detailed description is, therefore, not to be taken in a limiting sense, and the scope of embodiments of the inventive subject matter is defined only by the appended claims. Such embodiments of the inventive subject matter maybe referred to, individually and/or collectively, herein by the term "invention" merely for convenience and without intending to voluntarily limit the scope of this application to any single invention or inventive concept if more than one is in fact disclosed.

The present invention provides a solution to performance and reliability problems that are associated with prior art packaging of integrated circuits (ICs) that have high circuit density and that operate at high clock speeds and high power levels. In the present invention, decoupling and/or by-pass capacitors are positioned within the mounting region between an IC and an IC package substrate, particularly in the core region containing power conductors. Through this arrangement, capacitors can be placed close to the IC to minimize loop inductance for power delivery, while also minimizing resistance losses. In addition, the use of ceramic capacitors between the IC and the IC package substrate in certain embodiments can provide an improved CTE (coefficient of thermal expansion) match and improved operational reliability.

Various embodiments are illustrated and described herein.

In an embodiment, a front surface of an IC is flip-chip mounted to a substrate using "controlled collapse chip connect" (C4) technology, and a large capacitor array is sandwiched between the IC and the substrate, the capacitor having terminals of equivalent pitch to those of the IC and substrate.

A "capacitor array", as used herein, means a capacitor comprising at least one surface having more than one terminal of a given polarity type. Examples are illustrated in FIGS. 8, 16, 17, and 19 discussed further below.

In other embodiments, a plurality of capacitors are sandwiched between the IC terminals and the terminals of the package substrate. These terminals can be of various types.

In further embodiments, the substrate core contains a plurality of conductive, raised bar-like terminals to connect with suitable terminals in the core area of the IC, and capacitors are sandwiched between the bars.

The capacitors used in the various embodiments can be of different types and sizes. Discrete capacitors having only a single pair of terminals of opposite polarity can be used in different sizes. Capacitors having multiple terminals of two different polarities can be used in different sizes. Some capacitors have terminals of different polarity types on multiple surfaces. The particular capacitor type and size are selected based upon the desired functional and geometrical configuration of the IC package.

Also described are methods of fabricating an IC package substrate and an IC package, as well as application of the IC package to an electronic assembly and to an electronic system.

FIG. 1 is a block diagram of an electronic system 1 incorporating at least one electronic assembly 4 with sandwiched capacitors in accordance with an embodiment of the invention. Electronic system 1 is merely one example of an electronic system in which the present invention can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. A "processor", as used herein, means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDs), digital video disk (DVD), and the like.

Electronic system 1 can also include a display device 8, one or more speakers 9, and a keyboard and/or controller 20, which can include a mouse, trackball, game controller, voice-recognition device, or any other device that permits a system user to input information into and receive information from the electronic system 1.

Figure 2:
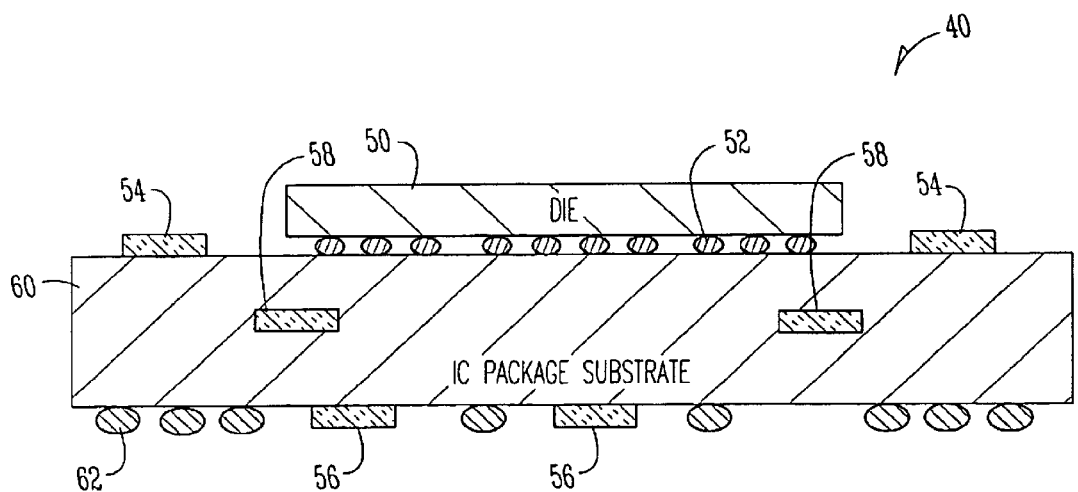
FIG. 2 is a cross-sectional view of a prior art IC package showing die side capacitors (DSCs), land side capacitors (LSCs), and embedded chip capacitors (ECCs)

FIG. 2 is a cross-sectional view of a prior art IC package 40 showing die side capacitors (DSCs) 54, land side capacitors (LSCs) 56, and embedded chip capacitors (ECCs) 58.

IC package 40 includes an IC or die 50 mounted in "flip-chip" orientation with its terminals or bumps (not shown) facing downward to couple with corresponding terminals or pads (not shown) on the upper surface of an IC package substrate 60 through solder balls 52.

IC package substrate 60 can be a single-layer or multi-layer board, and it can include additional terminals or lands (not shown) on its opposite surface for mating with additional packaging structure, such as a printed circuit board (not shown), through solder balls 62. IC package substrate 60 can form part of a chip package for packaging die 50.

As mentioned earlier, decoupling capacitors are often used to provide a stable signal or stable supply of power to the IC circuitry. Capacitors are further utilized to dampen power overshoot when an electronic device (e.g., an IC-based processor) is powered up, and to dampen power droop when the device begins using power. For example, a processor that begins performing a calculation may rapidly need more current than can be supplied by the on-chip capacitance. In order to provide such capacitance and to dampen the power droop associated with the increased load, off-chip capacitance should be available to respond to the current need within a sufficient amount of time. If insuffi-cient voltage is available to the processor, or if the response time of the capacitance is too slow, the die voltage may collapse.

The localized portions of a die that require large amounts of current in short periods of time are often referred to as die "hot spots." Off-chip capacitors, such as decoupling capacitors and capacitors for dampening power overshoot or droop, are generally placed as close as practical to a die load or hot spot in order to increase the capacitors' effectiveness. Often, the off-chip capacitors are surface-mounted to the die side or land side of the package upon which the die is mounted.

Die side capacitors 54, as their name implies, are mounted on the same side of the IC package 40 as the die 50. Land side capacitors 56 are mounted on the opposite side of the IC package 40, on the underside of IC package substrate 60. Embedded chip capacitors 58 are embedded in IC package substrate 60.

To be effective, the inductance of off-chip capacitors needs to be low. Thus, it is desirable to minimize the electrical distance between the off-chip capacitors and the die 50, thus reducing the inductance value. This can be achieved by placing the off-chip capacitors as electrically close as possible to the die 50.

Still referring to FIG. 2, DSCs 54 are mounted around the perimeter of the die 50, and provide capacitance to various points on the die through traces and vias (not shown) and planes in the IC package substrate 60. Because DSCs 54 are mounted around the perimeter of the die 50, the path length between a hot spot and a DSC 54 may result in a relatively high inductance feature between the hot spot and the DSC 54.

In contrast, LSCs 56 can be mounted directly below die 50 on the underside of IC package substrate 60, and thus directly below some die hot spots. Thus, in some cases, LSCs 56 can be placed electrically closer to the die hot spots than can DSCs 54, resulting in a lower inductance path between the die hot spot and the capacitance. However, the package also includes terminals (not shown), such as pins or lands, located on its land side. In some cases, placement of LSCs 56 on the package's land side would interfere with these land side terminals. Thus, the use of LSCs 56 is not always an acceptable solution to the inductance problem.

ECCs 58 are embedded in the IC package substrate 60 below the die 50, and they can generally be placed closer to the die 50 than either DSCs 54 or LSCs 56. However, an IC package substrate 60 can comprise a complex, extensive infrastructure of conductors, including traces, vias, conductive plates, reference planes, shunts, and the like. In some cases, placement of ECCs 58 within IC package substrate 60 would interfere with this infrastructure, so the use of ECCs 58 is not always feasible.

In addition to the inductance issues described above, additional issues are raised by the industry's trend to continuously reduce device sizes and packing densities. Because of this trend, the amount of package real estate available to surface-mounted capacitors and to embedded capacitors is becoming increasingly smaller.

Figure 3:
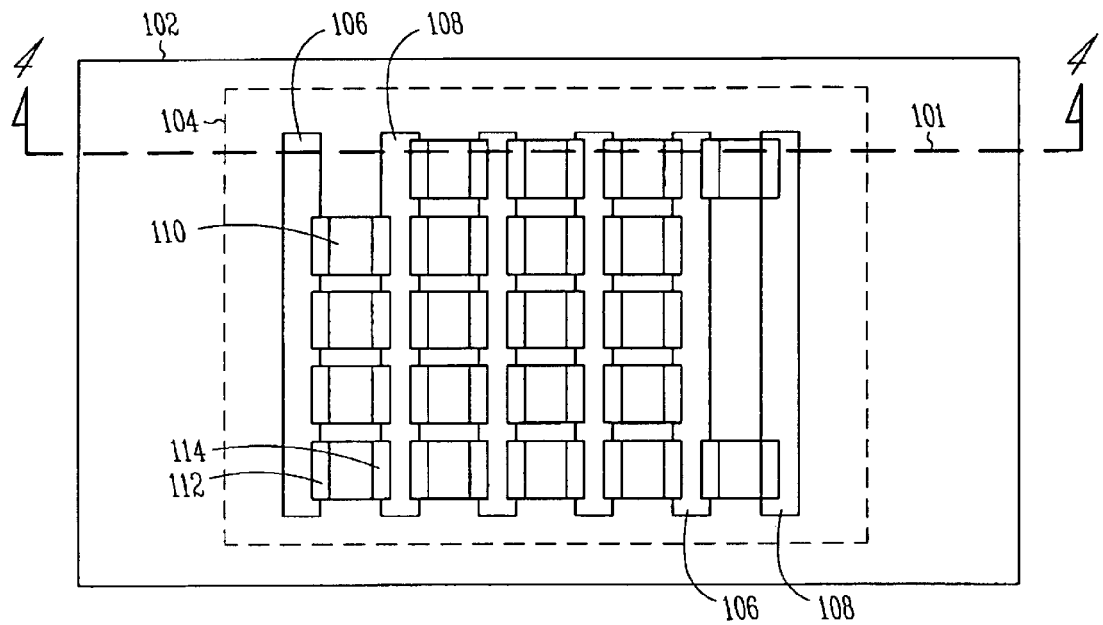
FIG. 3 illustrates a top view of an IC mounting region of an IC package substrate, and a plurality of relatively short capacitors overlying the IC mounting region, in accordance with an embodiment of the invention.

FIG. 3 illustrates a top view of an IC mounting region 104 of an IC package substrate 102, and a plurality of relatively short capacitors 110 overlying the IC mounting region 104, in accordance with an embodiment of the invention. IC package substrate 102 can be of any suitable type and composition, such as an organic or ceramic material.

"IC mounting region", as used herein, means an area on a surface of a substrate that contains mounting conductors, terminals, or pads.

IC mounting region 104, outlined by a dashed line, represents the projection of an IC (such as IC 122 of FIG. 4) upon IC package substrate 102. IC mounting region 104 comprises a plurality of conductors or terminals 106 and 108. Terminals 106 are of a first polarity type for coupling to a first potential (e.g. Vcc), and terminals 108 are of a second polarity type for coupling to a second potential (e.g. ground).

Conductors 106 and 108 can be of any suitable type, geometry, and composition. In an embodiment shown in FIG. 3, conductors 106 and 108 are conductive bars (also referred to as "C4 bars") that are disposed across the upper surface of IC package substrate 102.

Although conductors 106 and 108 are illustrated in FIG. 3 as being bar-like in shape, they could be ellipsoid, square, rectangular, or any other suitable shape. Also, although conductors 106 and 108 are shown as substantially parallel to one another, they need not necessarily be parallel, and they can be of any suitable geometric pattern. In one embodiment, conductors 106 and 108 are implemented as terminals or pads on the substantially planar upper surface of IC package substrate 102.

"Suitable", as used herein, means having characteristics that are sufficient to produce the desired result(s). Suitability for the intended purpose can be determined by one of ordinary skill in the art using only routine experimentation.

Figure 4:
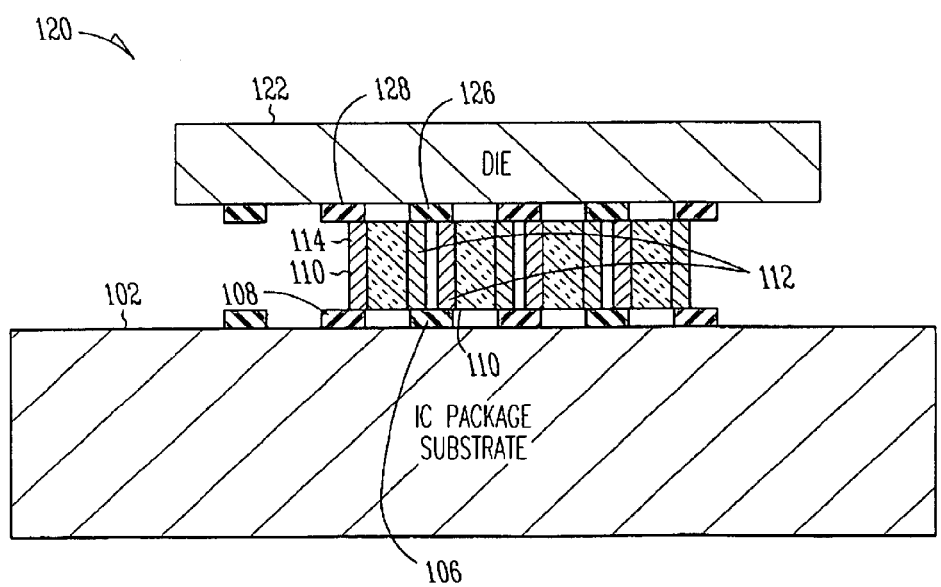
FIG. 4 illustrates a cross-sectional representation of an IC package, including a die, and a cross-sectional view of the capacitors and IC package substrate shown in FIG. 3 taken along line 101 of FIG. 3.

Each conductor 106 or 108 is to be electrically coupled to a respective terminal of an IC (such as IC 122, FIG. 4). Each conductor 106 or 108 is also physically and electrically coupled to a respective terminal of at least one capacitor 110. Capacitor 110 can be of the same type as capacitor 710 shown in FIG. 15 and described further below. In one embodiment, capacitor 110 is an "0201", i.e. 20 mils (0.508 mm) by 10 mils (0.254 mm).

Capacitors 110 comprise a terminal 112 of a first polarity type, and a terminal 114 of a second polarity type. Each terminal 112 of each capacitor 110 is physically and electrically coupled to a conductor 106 of a first polarity type. Likewise, each terminal 114 of each capacitor 110 is physically and electrically coupled to a conductor 108 of a second polarity type.

It will be noted that there is additional space for another capacitor 110 in the upper-left hand corner of IC mounting region 104, and for several additional capacitors 110 in the right-hand column of IC mounting region 104. Such capacitors 110 could be included, if desired, or not. The number and placement of capacitors 110 to be positioned within IC mounting region 104 can be varied as necessary to satisfy the particular requirements of the overall IC package. In one embodiment, the plurality of capacitors 110 are distributed substantially throughout the IC mounting region 104, and each capacitor 110 is in electrical contact with at least one of the conductors 106 or 108.

In the embodiment illustrated in FIG. 3, the plurality of capacitors 110 are arranged as a plurality of sets of capacitors 110. Each set of capacitors 110 comprises one or more capacitors that are aligned substantially end-to-end. For example, the capacitors 110 of each row of capacitors 110 in IC mounting region 104 can constitute a set of capacitors 110.

It will be noted that, in the embodiment illustrated in FIG. 3, capacitors 110 are mounted atop conductors 106 and 108. In other embodiments, such as that illustrated in FIGS. 10 and 11 to be discussed further below, the capacitors are located beside (e.g. between) the conductors of the IC package substrate.

FIG. 4 illustrates a cross-sectional representation of IC package 120, including die 122, and a cross-sectional view of capacitors 110 and IC package substrate 102 shown in FIG. 3 taken along line 101 of FIG. 3.

Die 122 can be of any suitable type. In one embodiment, die 122 is a high performance processor. In other embodiments, die 122 could be an ASIC, custom chip, wireless filter circuit, or any other type of circuit. The present invention is not limited to any particular type of die.

Die 122 comprises a plurality of bumps or terminals 126 and 128 on its lower surface. Terminals 126 are of a first polarity type (e.g. Vcc), and terminals 128 are of a second polarity type (e.g. ground). Terminals 126 and 128 can be of any suitable type, geometry, and composition. Although terminals 126 and 128 can be bar-like in shape (referred to in some embodiments as "Alternative Bump Metallurgy" (ABM)), they could alternatively be ellipsoid, square, rectangular, or any other suitable shape. In some embodiment, terminals 126 and 128 are metal bumps.

Terminals 126 and 128 can be formed of any suitable material, including metals or metal alloys known to those of ordinary skill in the art, such as lead, solder, copper, silver, aluminum, gold, etc.

Also, although terminals 126 and 128 are shown disposed over substantially the entire lower surface of die 122, in other embodiments, terminals 126 and 128 may be disposed primarily in a central or core region of the lower surface of die 122, and other terminals, such as input/output (I/O) terminals may be disposed around the periphery of the lower surface of die 122.

Still referring to FIG. 4, one of terminals 126 of die 122 is coupled to terminals 112 of two adjacent capacitors 110, and one of conductors 106 of IC package substrate 102 is coupled to the terminals 112 of the two adjacent capacitors 110. One of terminals 128 of die 122 is coupled to terminal 114 of capacitor 110, and one of conductors 108 of IC package substrate 102 is coupled to the terminal 114 of capacitor 110.

Die 122 is thus electrically coupled to IC package substrate 102 through terminals 126 and 128 of die 122, capacitors 110, and conductors 106 and 108 of IC package substrate 102.

Figure 5:
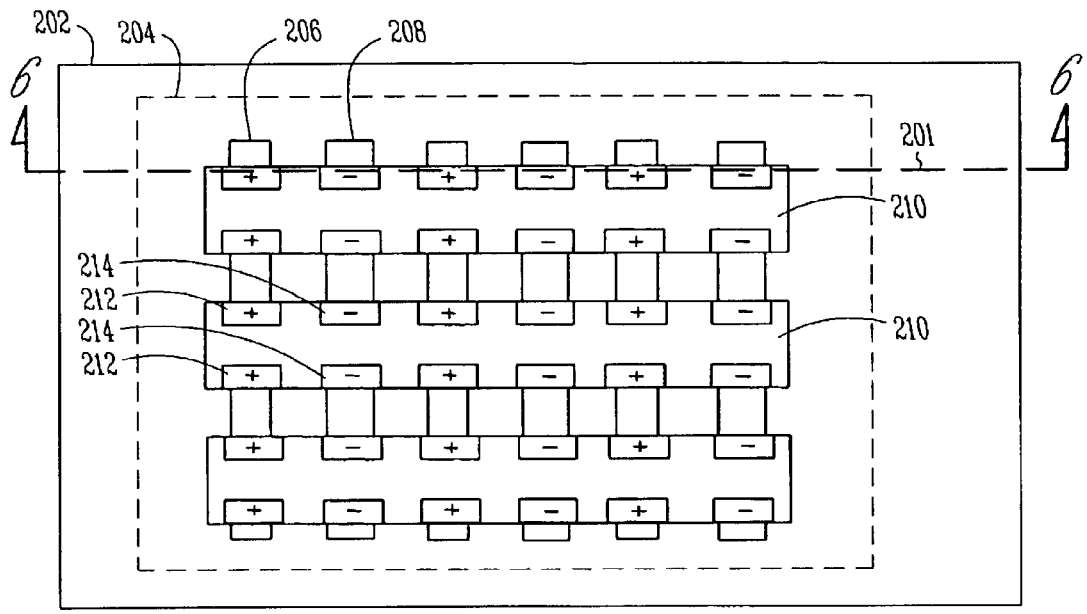
FIG. 5 illustrates a top view of an IC mounting region of an IC package substrate, and a plurality of relatively long capacitors overlying the IC mounting region, in accordance with an embodiment of the invention.

FIG. 5 illustrates a top view of an IC mounting region 204 of an IC package substrate 202, and a plurality of relatively long capacitors 210 overlying the IC mounting region 204, in accordance with an embodiment of the invention.

IC package substrate 202, IC mounting region 204, and conductors 206 and 208 can be similar to those previously illustrated in FIGS. 3 and 4.

Figure 6:
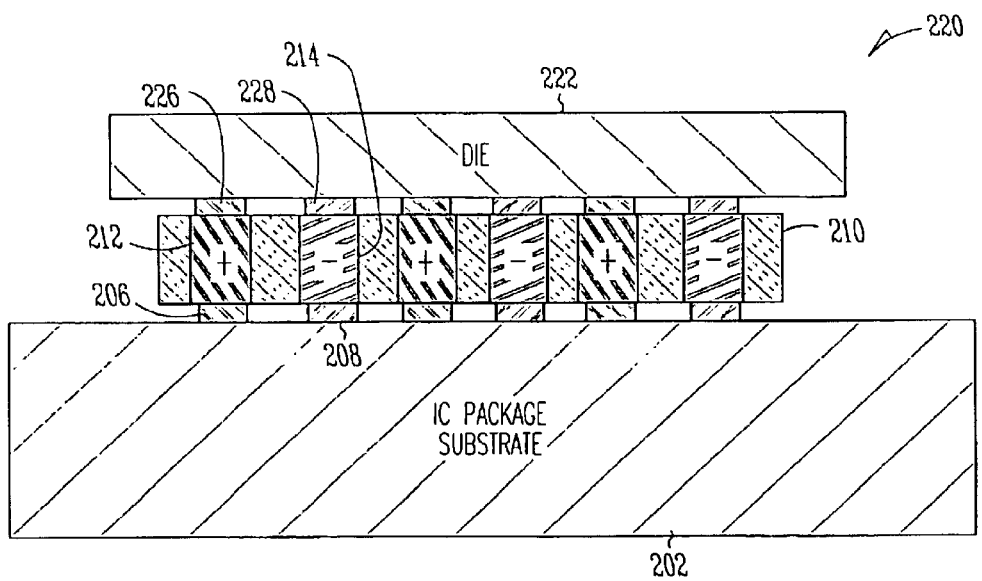
FIG. 6 illustrates a cross-sectional representation of an IC package, including a die, and a cross-sectional view of a capacitor and an IC package substrate shown in FIG. 5 taken along line 201 of FIG. 5.

Each conductor 206 or 208 is to be electrically coupled to a respective terminal of an IC (such as IC 222, FIG. 6). At least one capacitor 210 lies atop conductors 206 and 208.

Each conductor 206 or 208 is physically and electrically coupled to a respective terminal of at least one capacitor 210. Capacitor 210 can be of the same type as capacitor 720 shown in FIG. 16 and described further below. For example, each capacitor 210 comprises a plurality of terminals 212 of a first polarity type, and a plurality of terminals 214 of a second polarity type.

Each terminal 212 of each capacitor 210 is physically and electrically coupled to a conductor 206 of a first polarity type. Likewise, each terminal 214 of each capacitor 210 is physically and electrically coupled to a conductor 208 of a second polarity type.

More or fewer capacitors 210 could be utilized. The number and placement of capacitors 210 to be positioned within IC mounting region 204 can be varied as necessary to satisfy the particular requirements of the overall IC package. In one embodiment, the plurality of capacitors 210 are distributed substantially throughout the IC mounting region 204, and each capacitor 210 is in electrical contact with at least one of the conductors 206 or 208.

FIG. 6 illustrates a cross-sectional representation of an IC package 220, including a die 222, and a cross-sectional view of a capacitor 210 and IC package substrate 202 shown in FIG. 5 taken along line 201 of FIG. 5. In this view, the section is taken through terminals 206 and 208 that are disposed along one edge of the uppermost capacitor 210.

Die 222 comprises a plurality of bumps or terminals 226 and 228 on its lower surface. Terminals 226 and 228 can be similar to those shown and described above regarding FIG. 4.

One of terminals 226 of die 222 is coupled to terminal 212 of capacitor 210, and one of conductors 206 of IC package substrate 202 is coupled to terminal 212 of capacitor 210. One of terminals 228 of die 222 is coupled to terminal 214 of capacitor 210, and one of conductors 208 of IC package substrate 202 is coupled to terminal 214 of capacitor 210.

Die 222 is thus electrically coupled to IC package substrate 202 through terminals 226 and 228 of die 222, capacitor 210, and conductors 206 and 208 of IC package substrate 202.

Figure 7:
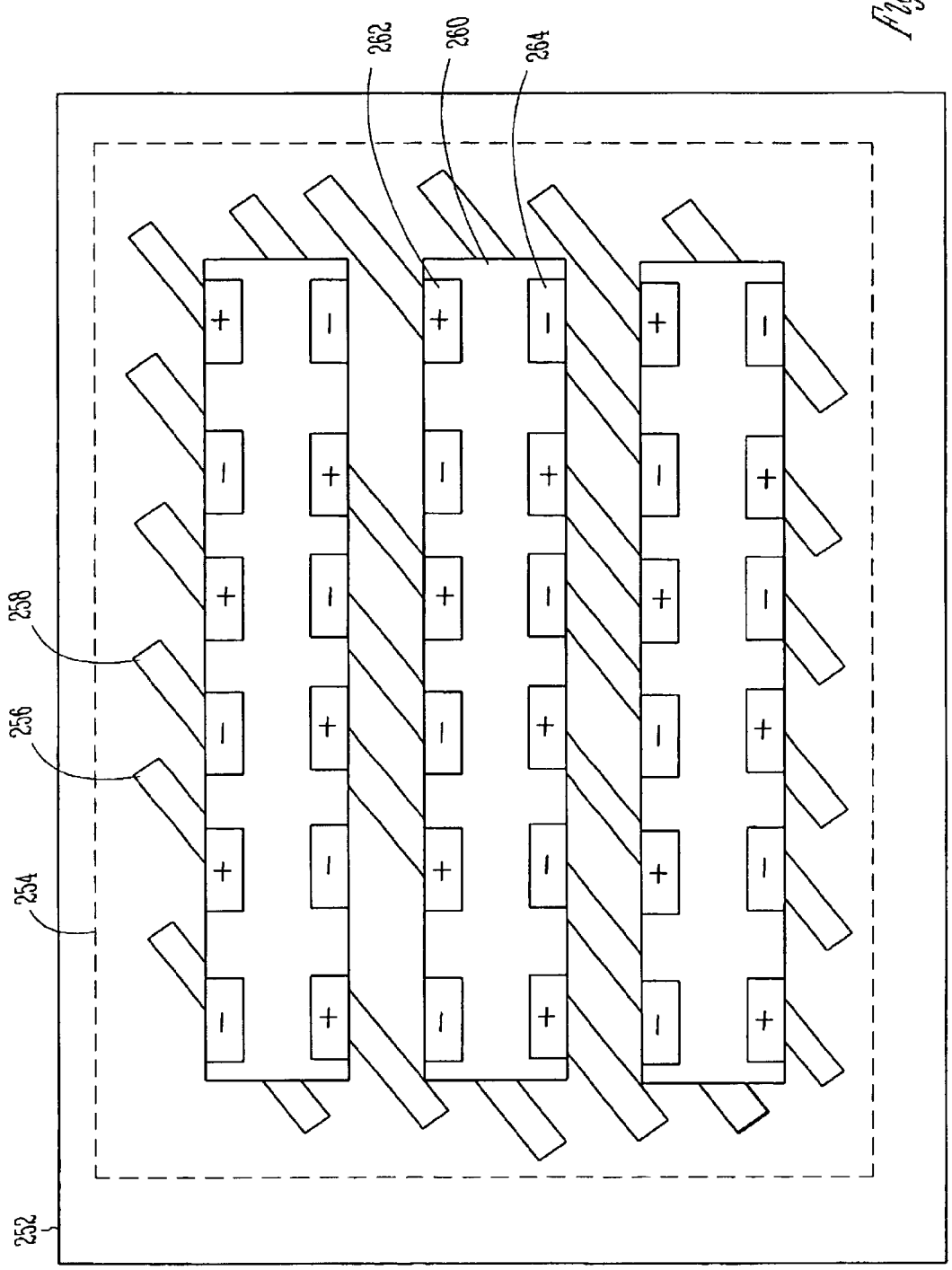
FIG. 7 illustrates a top view of an IC mounting region of an IC package substrate, and a plurality of relatively long capacitors overlying the IC mounting region, in accordance with an embodiment of the invention.

FIG. 7 illustrates a top view of an IC mounting region 254 of an IC package substrate 252, and a plurality of relatively long capacitors 260 overlying the IC mounting region 254, in accordance with an embodiment of the invention.

IC package substrate 252 and IC mounting region 254 can be similar to those previously illustrated in FIGS. 5 and 6. In this embodiment, conductors 256 and 258 are long parallel conductors, similar to those illustrated in FIG. 5, except that conductors 256 and 258 are arranged on a diagonal (i.e., non-orthogonally) rather than being orthogonal to capacitors 260. Capacitors 260 lie atop conductors 256 and 258. In other embodiments, conductors 256 and 258 could be arranged in other orthogonal or non-orthogonal patterns, such as but not limited to concentric circles, concentric rectangles, L's, zigzags, serpentine patterns, or combinations thereof.

Each conductor 256 or 258 is physically and electrically coupled to a respective terminal of at least one capacitor 260. Capacitor 260 can be of the same type as capacitor 730 shown in FIG. 17 and described further below. For example, each capacitor 260 comprises a plurality of terminals 262 of a first polarity type, and a plurality of terminals 264 of a second polarity type. Each terminal 262 of each capacitor 260 is physically and electrically coupled to a conductor 256 of a first polarity type. Likewise, each terminal 264 of each capacitor 260 is physically and electrically coupled to a conductor 258 of a second polarity type.

More or fewer capacitors 260 could be utilized. The number and placement of capacitors 260 to be positioned within IC mounting region 254 can be varied as necessary to satisfy the particular requirements of the overall IC package. In one embodiment, the plurality of capacitors 260 are distributed substantially throughout the IC mounting region 254, and each capacitor 260 is in electrical contact with at least one of the conductors 256 or 258.

Figure 8:
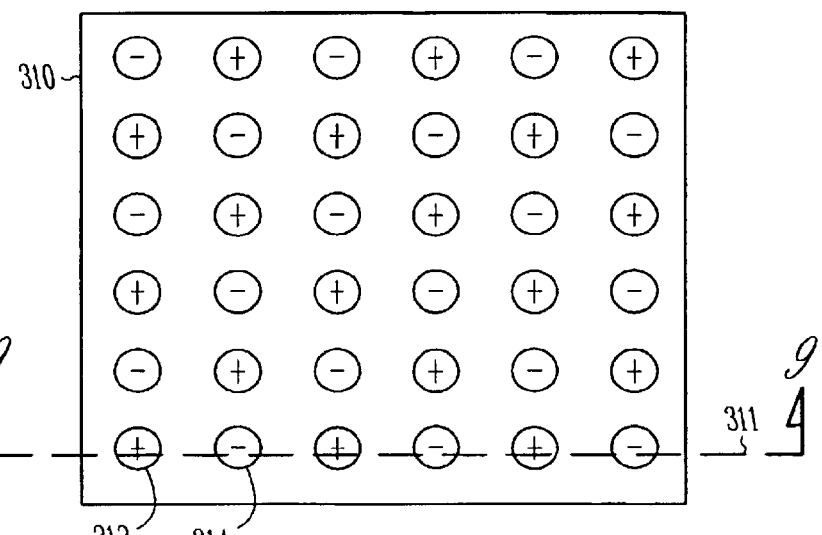
FIG. 8 illustrates a top view of a capacitor array, in accordance with an embodiment of the invention.

FIG. 8 illustrates a top view of a capacitor array 310, in accordance with an embodiment of the invention. Capacitor array 310 comprises a plurality of terminals 312 of a first polarity type, and a plurality of terminals 314 of a second polarity type. Although capacitor array 310 is illustrated as being substantially square, it could be implemented in any other suitable geometry. Also, while terminals 312 and 314 are illustrated as being arranged in a grid of alternating polarity types, and that they are disposed over substantially the entire upper surface of capacitor array 310, they could be arranged in many other different patterns and groupings. The invention is not intended to be limited to any particular type of capacitor array 310.

In one embodiment, each terminal 312 on the upper surface of capacitor array 310 has a corresponding terminal 342 of the same polarity type on the lower surface. Likewise, each terminal 314 on the upper surface of capacitor array 310 has a corresponding terminal 344 of the same polarity type on the lower surface. In other embodiments, capacitor array 310 can have terminals arranged in a different manner on its upper and lower surfaces. For example, the terminals can be bar-like terminals, or terminals of other geometrical shapes, or they can be a combination of different shapes of terminals. In one embodiment, capacitor array 310 can be a large-scale chip capacitor.

Figure 9:
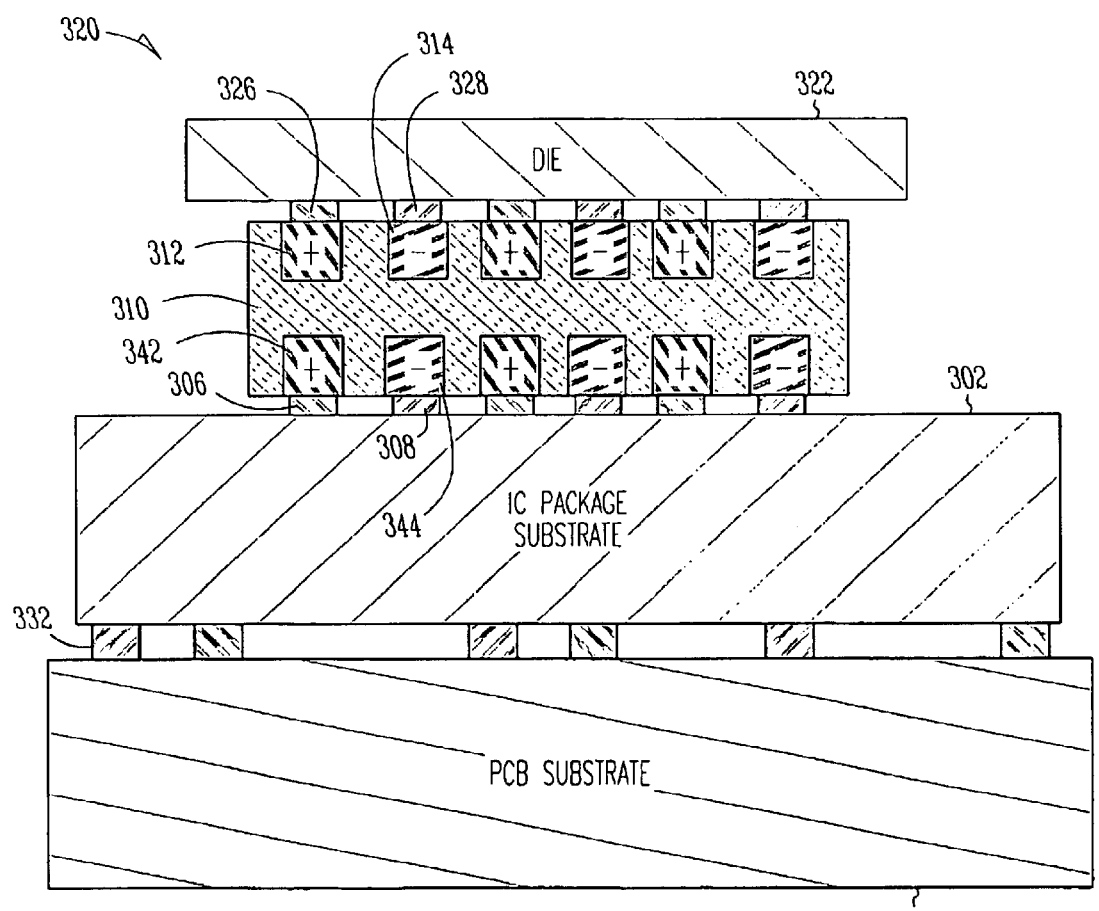
FIG. 9 illustrates a cross-sectional representation of an IC package, including a die, and a cross-sectional view of the capacitor array shown in FIG. 8 taken along line 311 of FIG. 8.

FIG. 9 illustrates a cross-sectional representation of an IC package 320, including a die 322, and a cross-sectional view of the capacitor array 310 shown in FIG. 8 taken along line 311 of FIG. 8.

In this view, the section is taken through terminals 312 and 314 that are disposed closest to the lower edge of capacitor array 310. As mentioned earlier, in this embodiment of capacitor array 310, each terminal 312 on the upper surface of capacitor array 310 has a corresponding terminal 342 of identical polarity type on the lower surface of capacitor array 310. Likewise, each terminal 314 on the upper surface of capacitor array 310 has a corresponding terminal 344 of identical polarity type on the lower surface of capacitor array 310. However, in other embodiments of capacitor array 310, the arrangement of terminals on the upper and lower surfaces of capacitor array 310 could be different.

Die 322 comprises a plurality of bumps or terminals 326 and 328 on its lower surface. Terminals 326 and 328 are of first and second polarity types, respectively. Terminals 326 and 328 are arranged on the lower surface of die 322 in a pitch and placement corresponding to the pitch and placement of terminals 312 and 314, respectively, of capacitor array 310.

One of terminals 326 of a first polarity type of die 322 is coupled to terminal 312 of a first polarity type on the upper surface of capacitor array 310, and one of terminals 342 of the first polarity type on the lower surface of capacitor array 310 is coupled to a conductor 306 of a first polarity type of IC package substrate 302.

Similarly, one of terminals 328 of a second polarity type of die 322 is coupled to terminal 314 of a second polarity type on the upper surface of capacitor array 310, and one of terminals 344 of the second polarity type on the lower surface of capacitor array 310 is coupled to a conductor 308 of the second polarity type of IC package substrate 302.

Die 322 is thus electrically and physically coupled to IC package substrate 302 through terminals 326 and 328 of die 322, capacitor array 310, and conductors 306 and 308 of IC package substrate 302.

In FIG. 9, capacitor array 310 is illustrated as having a relatively large footprint in the core area of die 322; however, in other embodiments it can have a relatively smaller footprint, leaving relatively more area on the lower surface of die 322 for I/O terminals.

IC package 320 can form part of an electronic assembly. For example, as shown in FIG. 9, IC package 320 can be mounted upon suitable mounting terminals (not shown) of a printed circuit board (PCB) substrate 330, using terminals 332 on the under side of IC package substrate 302.

Figure 10:
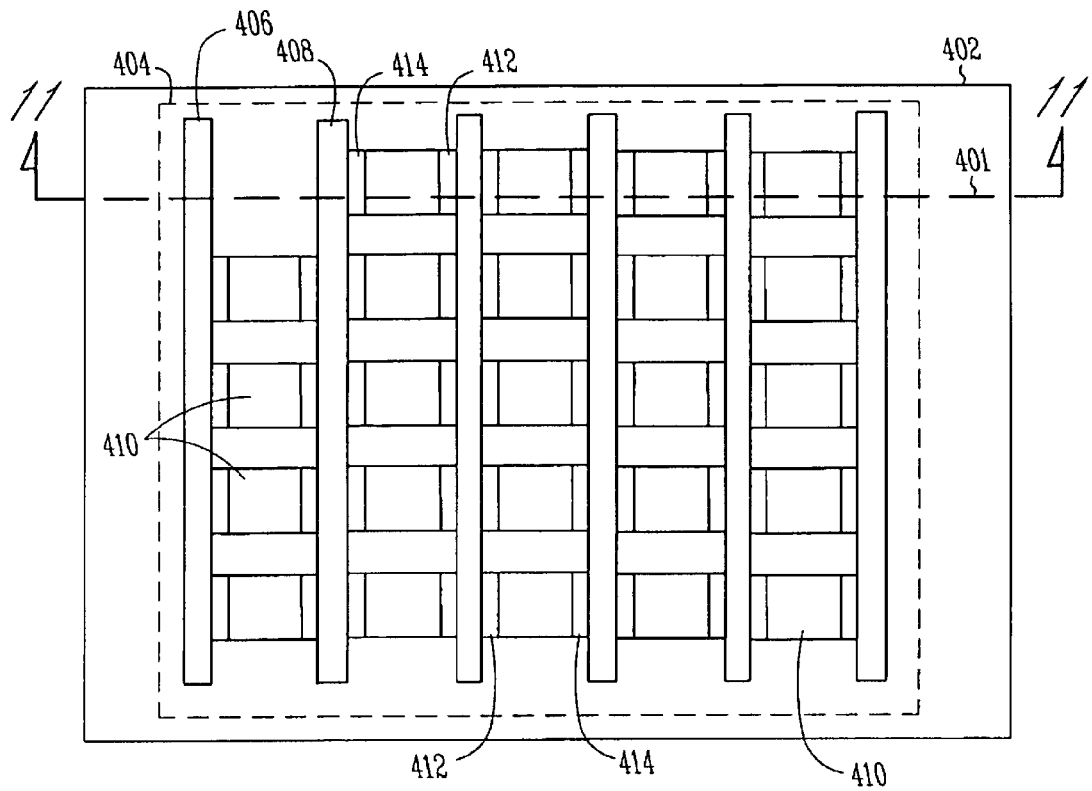
FIG. 10 illustrates a top view of an IC mounting region of an IC package substrate, and a plurality of relatively short capacitors disposed between conductive bars in the IC mounting region, in accordance with an embodiment of the invention.

FIG. 10 illustrates a top view of an IC mounting region 404 of an IC package substrate 402, and a plurality of relatively short capacitors 410 disposed between conductive bars 406 and 408 in the IC mounting region 404, in accordance with an embodiment of the invention.

IC package substrate 402 can be of the same or similar type as IC package substrate 102 in FIG. 3. Each conductor 406 or 408 is to be physically and electrically coupled to a respective terminal of an IC (such as IC 122, FIG. 4). Each conductor 406 or 408 is also physically and electrically coupled to a respective terminal of at least one capacitor 410.

Conductors 406 and 408 can be of any suitable type, geometry, and composition. Although conductors 406 and 408 are illustrated in FIG. 10 as being bar-like in shape, they could be ellipsoid, square, rectangular, or any other suitable shape. Also, although conductors 406 and 408 are shown as substantially parallel to one another, they need not necessarily be parallel, and they can be of any suitable geometric pattern.

Capacitors 410 can be of the same type as capacitor 710 shown in FIG. 15 and described further below. For example, each capacitor 410 comprises terminals 412 and 414 of first and second polarity types, respectively. Each terminal 412 of each capacitor 410 is physically and electrically coupled to a conductor 406 of a first polarity type. Likewise, each terminal 414 of each capacitor 410 is physically and electrically coupled to a conductor 408 of a second polarity type.

It will be noted that there is additional space for another capacitor 410 in the upper-left hand corner of IC mounting region 404. Another capacitor 410 could be included, if desired, or not. The number and placement of capacitors 410 to be positioned within IC mounting region 404 can be varied as necessary to satisfy the particular requirements of the overall IC package. In one embodiment, the plurality of capacitors 410 are distributed substantially throughout the IC mounting region 404, and each capacitor 410 is in electrical contact with at least one of the conductors 406 or 408.

In the embodiment illustrated in FIG. 10, the plurality of capacitors 410 are arranged as a plurality of sets of capacitors 410. Each set of capacitors 410 comprises one or more capacitors that are aligned substantially end-to-end. For example, the capacitors 410 of each row of capacitors 410 in IC mounting region 404 can constitute a set of capacitors 410.

It will be noted that, in the embodiment illustrated in FIG. 10, capacitors 410 are mounted beside (e.g. between) conductors 406 and 408 of the IC package substrate 402.

Figure 11:
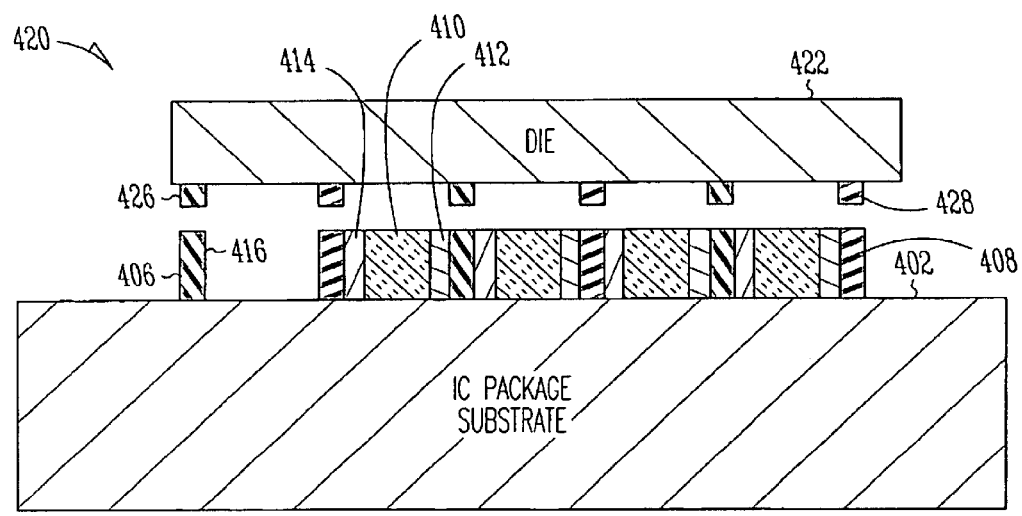
FIG. 11 illustrates a cross-sectional representation of an IC package, including a die, and a cross-sectional view of the capacitors and IC package substrate shown in FIG. 10 taken along line 401 of FIG. 10.

FIG. 11 illustrates a cross-sectional representation of an IC package 420, including a die 422, and a cross-sectional view of the capacitors 410 and IC package substrate 402 shown in FIG. 10 taken along line 401 of FIG. 10.

In this view, the section is taken through the row of capacitors 410 that are disposed closest to the upper edge of IC mounting region 404.

Die 422 can be of the same or similar type to die 122 of FIG. 4. In one embodiment, die 422 has a plurality of bar-like terminals 426 and 428 to mate with corresponding bar-like conductors 406 and 408, respectively, of IC package substrate 402.

IC package substrate 402 can be of any type. For example, it can be identical to or the same as IC package substrate 102, except that conductors 406 and 408 have greater thickness. In one embodiment, the height of conductors 406 and 408 exceeds their width. Between adjacent conductors 406 and 408 is an opening 416 to accommodate a capacitor 410.

Each conductor 406 or 408 is to be physically and electrically coupled to a respective terminal 426 or 428 of die 422. Each conductor 406 or 408 is also physically and electrically coupled to a respective terminal of at least one capacitor 410. As mentioned above, capacitors 410 comprise a terminal 412 of a first polarity type, and a terminal 414 of a second polarity type. Each terminal 412 of each capacitor 410 is physically and electrically coupled to a conductor 406 of a first polarity type. Likewise, each terminal 414 of each capacitor 410 is physically and electrically coupled to a conductor 408 of a second polarity type.

Figure 12:
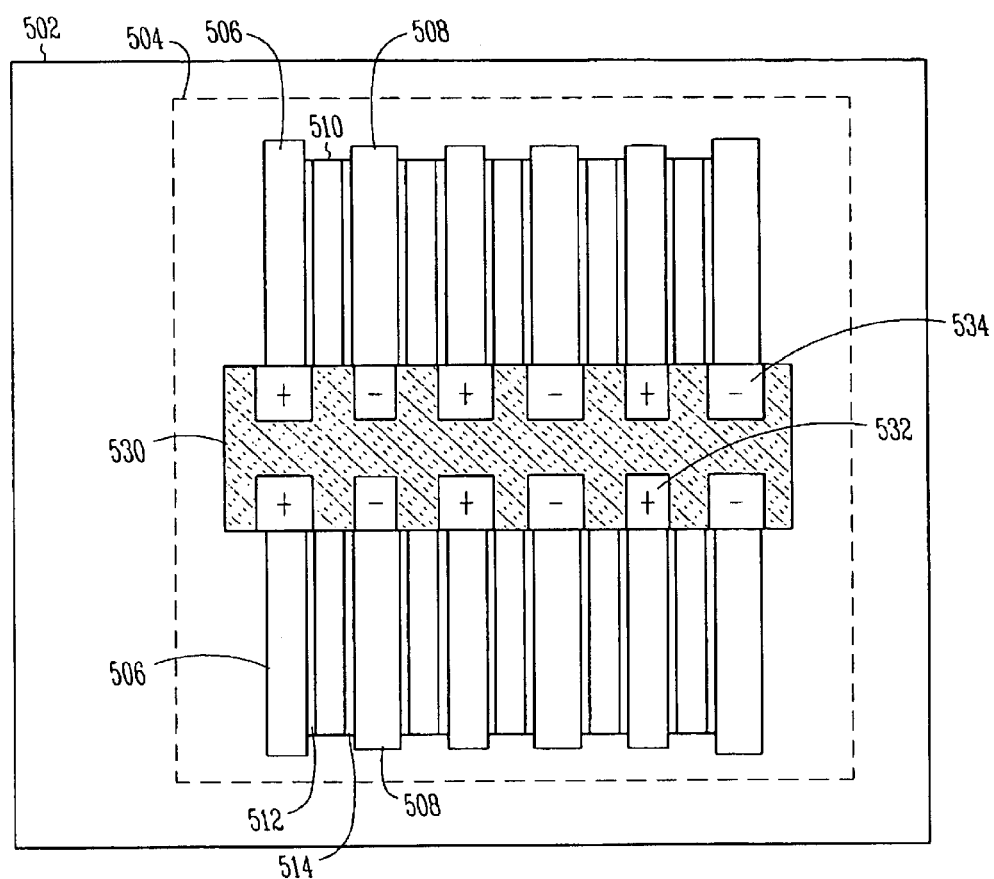
FIG. 12 illustrates a top view of an IC mounting region of an IC package substrate, and a plurality of capacitors disposed between conductive bars in the IC mounting region, in accordance with an embodiment of the invention.

FIG. 12 illustrates a top view of an IC mounting region 504 of an IC package substrate 502, and a plurality of capacitors 510 and 530 disposed between conductive bars 506 and 508 in the IC mounting region 504, in accordance with an embodiment of the invention.

IC package substrate 502 can be of the same or similar type as IC package substrate 402 in FIG. 10, with the exception that some or all of conductors 506 or 508 can have a gap to accommodate a transverse capacitor such as capacitor 530. Conductors 506 and 508 are to be physically and electrically coupled to respective terminals of an IC (such as IC 422, FIG. 11). Each conductor 506 or 508 is also physically and electrically coupled to a respective terminal of at least one capacitor 510 that lies beside and between adjacent conductors 506 and 508.

Capacitors 510 can be of the same type as capacitor 740 shown in FIG. 18 and described further below. For example, each capacitor 510 comprises terminals 512 and 514 of first and second polarity types, respectively. Each terminal 512 of each capacitor 510 is physically and electrically coupled to a conductor 506 of a first polarity type. Likewise, each terminal 514 of each capacitor 510 is physically and electrically coupled to a conductor 508 of a second polarity type.

Capacitor 530 can be of the same type as capacitor 720 shown in FIG. 16 and described further below. For example, each capacitor 530 comprises terminals 532 and 534 of first and second polarity types, respectively. Each terminal 532 of capacitor 530 is physically and electrically coupled to a conductor 506 of a first polarity type. Likewise, each terminal 534 of capacitor 530 is physically and electrically coupled to a conductor 508 of a second polarity type. Although in the embodiment illustrated in FIG. 12, only one transverse capacitor 530 is shown, more than one could be utilized, provided that conductors 506 and 508 contained appropriate gaps to accommodate them.

Although not illustrated, a die having power supply terminals of suitable pitch and placement corresponding to terminals 506 and 508 of IC package substrate 502 could be mounted upon IC package substrate 502 to form an IC package. This could be similar to the manner in which die 422 is mounted upon IC package substrate 402 to form an IC package 420, as shown in FIG. 11.

Figure 13:
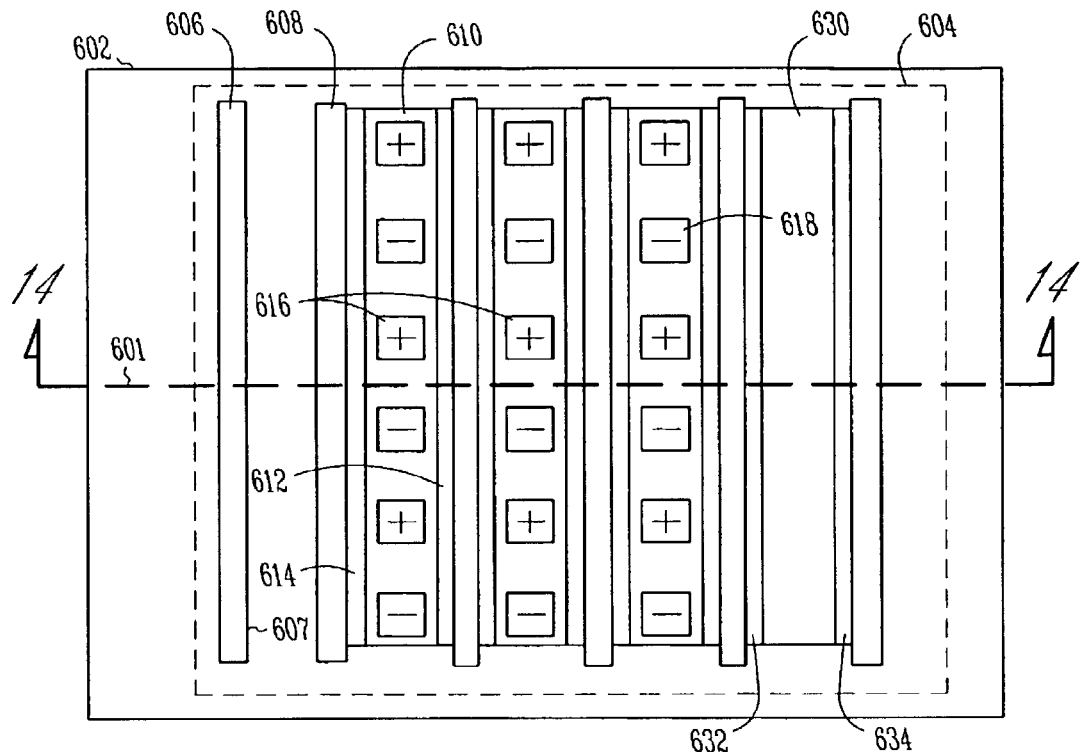
FIG. 13 illustrates a top view of an IC mounting region of an IC package substrate, and a plurality of relatively long capacitors disposed between conductive bars in the IC mounting region, in accordance with an embodiment of the invention.

FIG. 13 illustrates a top view of an IC mounting region 604 of an IC package substrate 602, and a plurality of relatively long capacitors 610 and 630 disposed between conductive bars 606 and 608 in the IC mounting region 604, in accordance with an embodiment of the invention.

IC package substrate 602 can be of the same or similar type as IC package substrate 402 in FIG. 10. Conductors 606 and 608 are to be physically and electrically coupled to respective terminals of an IC (such as IC 622, FIG. 14). Each conductor 606 or 608 is also physically and electrically coupled to a respective terminal of at least one capacitor 610 and/or 630 that lies beside and between adjacent conductors 606 and 608.

Capacitors 610 can be of the same type as capacitor 750 shown in FIG. 19 and described further below. For example, each capacitor 610 comprises terminals 612 and 614 of first and second polarity types, respectively. Each terminal 612 of each capacitor 610 is physically and electrically coupled to a conductor 606 of a first polarity type. Likewise, each terminal 614 of each capacitor 610 is physically and electrically coupled to a conductor 608 of a second polarity type.

Each capacitor 610 further comprises additional terminals 616 and 618 on its upper surface. Terminals 616 and 618 are of first and second polarity types, respectively. Terminals 616 and 618 on the upper surface of each capacitor 610 are to couple to terminals having corresponding pitch, placement, and polarity type on an IC, such as die 622 (FIG. 14).

Capacitor 630 can be of the same type as capacitor 740 shown in FIG. 18 and described further below. For example, each capacitor 630 comprises terminals 632 and 634 of first and second polarity types, respectively. Each terminal 632 of capacitor 630 is physically and electrically coupled to a conductor 606 of a first polarity type. Likewise, each terminal 634 of capacitor 610 is physically and electrically coupled to a conductor 608 of a second polarity type. Although in the embodiment illustrated in FIG. 14, only one capacitor 630 is shown, more than one could be utilized.

It will be noted that there is additional space for another capacitor 610 or 630 in space 607 of IC mounting region 604, and such other capacitor 610 or 630 could be included, if desired, or not. The number and placement of capacitors 610 and 630 to be positioned within IC mounting region 604 can be varied as necessary to satisfy the particular requirements of the overall IC package. Although two different types of capacitors are illustrated in FIG. 13, fewer or more than two different types could be used. The particular choice and number of capacitors is within the skill of the average practitioner in the art.

Figure 14:
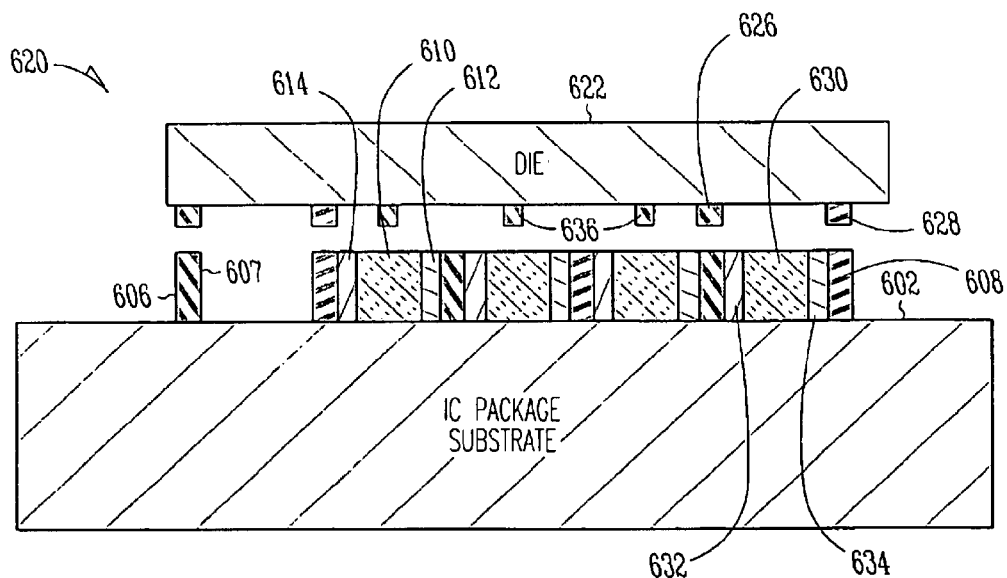
FIG. 14 illustrates a cross-sectional representation of an IC package, including a die, and a cross-sectional view of the capacitors and IC package substrate shown in FIG. 13 taken along line 601 of FIG. 13.

FIG. 14 illustrates a cross-sectional representation of an IC package 620, including a die 622, and a cross-sectional view of the capacitors 610 and 630 and IC package substrate 602 shown in FIG. 13 taken along line 601 of FIG. 13.

Die 622 can be of the same or similar type to die 422 of FIG. 11. In one embodiment, die 622 has a plurality of bar-like terminals 626 and 828 to mate with corresponding bar-like conductors 606 and 608, respectively, of IC package substrate 602. Die 622 further comprises terminals 636 of a first polarity type. Terminals 636 are to couple to corresponding terminals 616 of the first polarity type on the upper surface of capacitors 610. Die 622 also comprises terminals (not shown) of a second polarity type to couple to corresponding terminals 618 of the second polarity type on the upper surface of capacitors 610.

IC package substrate 602 can be of any type. For example, it can be identical to or the same as IC package substrate 402 shown in FIGS. 10 and 11.

Each conductor 606 or 608 of IC package substrate 602 is to be physically and electrically coupled to a respective terminal 626 or 628 of die 622. Each conductor 606 or 608 can also be physically and electrically coupled to a respective side terminal of a capacitor 610 or 630, as previously discussed.

Figure 15:
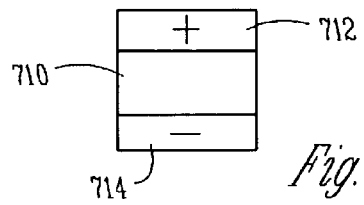
FIG. 15 illustrates a top view of a relatively short capacitor as used in an embodiment of the invention.

FIG. 15 illustrates a top view of a relatively short capacitor 710 as used in an embodiment of the invention. Capacitor 710 comprises terminals 712 and 714 of first and second polarity types, respectively, on opposing sides of capacitor 710. Although terminals 712 and 714 are illustrated as being disposed on the shorter sides of capacitor 710, they could alternatively be disposed on the longer sides. Capacitor 710 is commercially available from various capacitor manufacturers.

Figure 16:
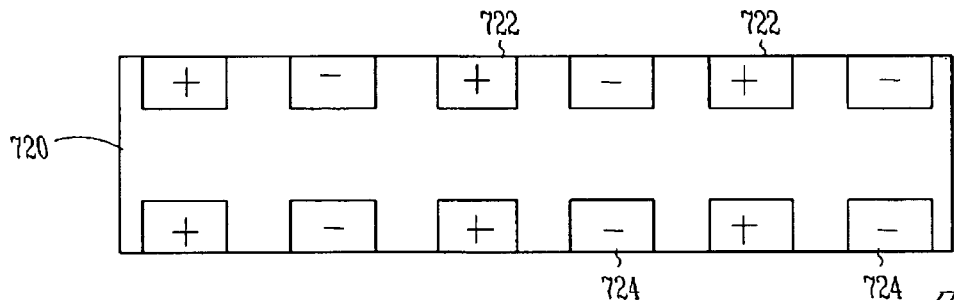
FIG. 16 illustrates a top view of one type of relatively long capacitor as used in an embodiment of the invention.

FIG. 16 illustrates a top view of one type of relatively long capacitor 720 as used in an embodiment of the invention. Capacitor 720 comprises a plurality of terminals 722 and 724 of first and second polarity types, respectively. Terminals 722 and 724 are alternated along two opposing sides of capacitor 720, and terminals of like polarity appear opposite one another. Capacitor 720 is called an interdigitated capacitor.

Figure 17:
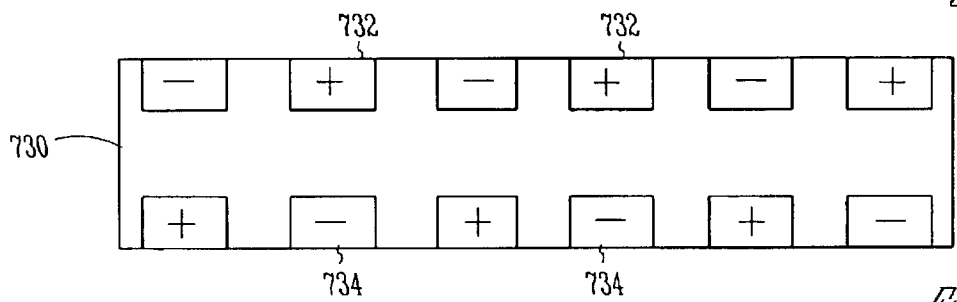
FIG. 17 illustrates a top view of another type of relatively long capacitor as used in an embodiment of the invention.

FIG. 17 illustrates a top view of another type of relatively long capacitor 730 as used in an embodiment of the invention. Capacitor 730 comprises a plurality of terminals 732 and 734 of first and second polarity types, respectively. Terminals 732 and 734 are alternated along two opposing sides of capacitor 730, and terminals of opposite polarity appear opposite one another. Capacitor 730 is called an interdigitated capacitor. Interdigitated capacitors are commercially available from AVX, Myrtle Beach, S.C., whose URL is currently www.avxcorp.com; TDK Corporation, Mount Prospect, Ill., whose URL is currently www.tdk.com; and Murata Electronics, Smyrna, Ga., whose URL is currently www.murata.com.

Figure 18:
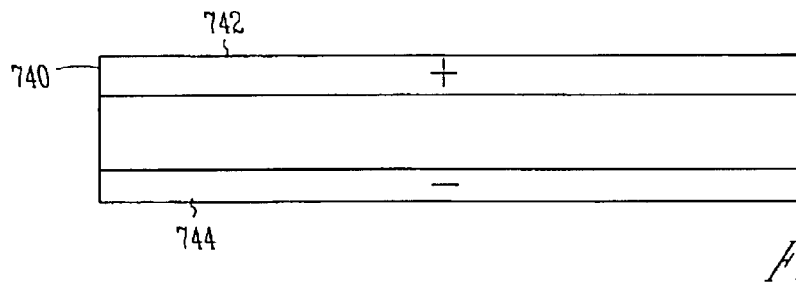
FIG. 18 illustrates a top view of a further type of relatively long capacitor as used in an embodiment of the invention.

FIG. 18 illustrates a top view of a further type of relatively long capacitor 740 as used in an embodiment of the invention. Capacitor 740 comprises terminals 742 and 744 of first and second polarity types, respectively, each being disposed along one of two opposing sides of capacitor 740. Capacitor 740 is basically a stretched version of capacitor 710 of FIG. 15.

Figure 19:
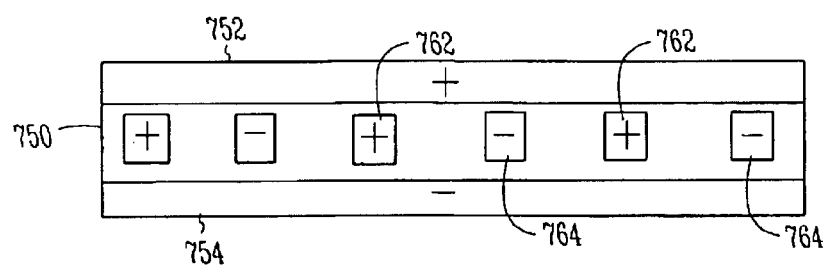
FIG. 19 illustrates a top view of yet another type of relatively long capacitor as used in an embodiment of the invention.

FIG. 19 illustrates a top view of yet another type of relatively long capacitor 750 as used in an embodiment of the invention. Capacitor 750 comprises terminals 752 and 754 of first and second polarity types, respectively, each being disposed along one of two opposing sides of capacitor 750. In addition, capacitor 750 comprises a plurality of terminals 762 and 764 on a third surface (e.g. a top surface) of first and second polarity types, respectively. In other embodiments, capacitor 750 can also comprise a plurality of terminals (not seen) on a fourth surface (e.g. a bottom surface) of first and second polarity types, respectively. Capacitor 750 is described in greater detail in the Related application identified above.

It will be noted that many types of capacitors that can be used in the present invention have a coefficient of thermal expansion (CTE) that approximates that of the silicon die. This is the case, for example, for ceramic chip capacitors. This can result in a substantial improvement in CTE compatibility between the die and the package substrate. It may be feasible, depending upon the IC package, to eliminate underfill, thus reducing fabrication costs and complexity.

FIGS. 20, 21, 22, 23, 24, and 25 illustrate cross-sectional representations illustrating stages of fabricating an IC package comprising sandwiched capacitors, in accordance with an embodiment of the invention. This fabrication sequence is merely illustrative and is not intended to be limiting, because other sequences could also be used.

Figure 20:
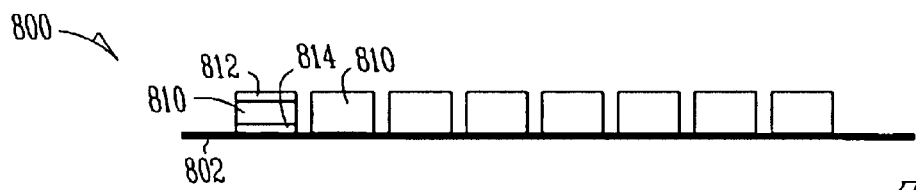

FIG. 20 illustrates fabricating a capacitor assembly 800 by arranging a first layer of discrete capacitors 810 on a conductive layer 802. Capacitors 810 are suitably secured to conductive layer 802. Discrete capacitors 810 can be similar or identical to capacitor 710 shown in FIG. 15, each having a pair of terminals 812 and 814 of first and second polarity types, respectively. (Terminals 812 and 814 are shown only on one capacitor 810 for ease of illustration.) In this operation, a plurality of capacitors 810 are arranged side-by-side on a conductive layer 802 to form a capacitor assembly. Layer 802 can be any suitable conductor, such as copper, aluminum, or any other conductor well known to those of ordinary skill in the art. Layer 802 can be of any suitable thickness. Although capacitors 810 are illustrated as being of approximately equal length, they could be of different lengths.

Figure 21:
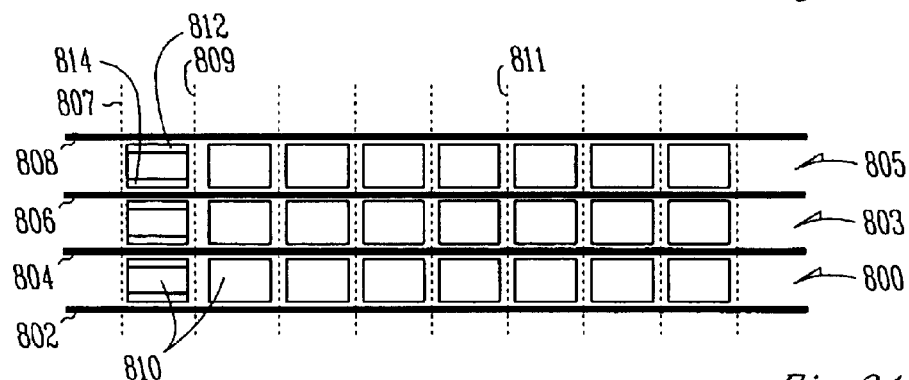

FIG. 21 illustrates fabricating additional layers of discrete capacitors. In this operation, a plurality of capacitor assemblies 800, 803, and 805 have been aligned (e.g., as indicated by the ends of capacitors 810 being aligned within the dashed lines, such as dashed lines 807 and 809), and then suitably affixed to each other. Capacitor assemblies 803 and 805 were fabricated similar to capacitor assembly 800, and they each comprise a row of capacitors 810 on a conductive layer 804 and 806, respectively. A conductive layer 808 has been affixed to the uppermost capacitor assembly 805.

Figure 22:
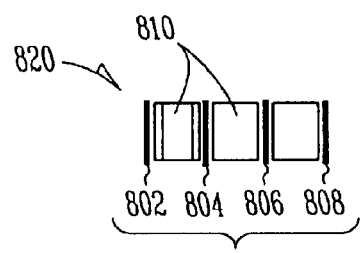

FIG. 22 illustrates segmenting a stack of capacitor assemblies into a capacitor group 820. Capacitor group 820 is formed by segmenting the stack of capacitor assemblies of FIG. 21 along dashed lines 807 and 809 and rotating the segmented piece ninety (90) degrees.

Figure 23:
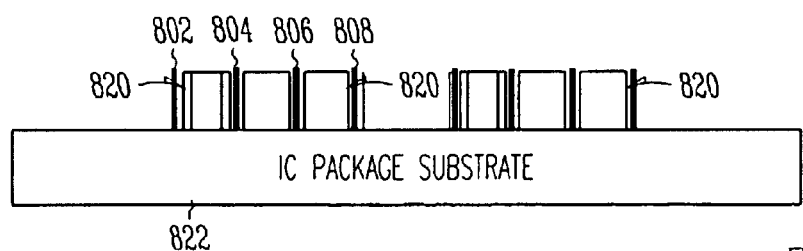

FIG. 23 illustrates mounting capacitor groups 820 on an IC package substrate 822. Each capacitor group 820 is suitably secured to a surface of an IC package substrate 822, for example, using solder or other electrically conductive adhesive or connector. Each capacitor group 820 includes conductive bars, in the form of conductive layers, such as conductive layers 802, 804, 806, and 808. These can be similar in thickness and function to conductive bars 406 and 408 of the embodiment illustrated in FIGS. 10 and 11. Although conductive layers 802, 804, 806, and 808 are illustrated as relatively thin in FIGS. 20–25, they can be relatively thick in other embodiments, such as the embodiment shown in FIGS. 10 and 11.

In FIG. 23, the depth (i.e. the number of capacitor groups 820 into the page) can be varied to any desired depth, depending upon how the capacitor groups 820 are segmented from the assemblage of capacitor assemblies 800, 803, and 805 shown in FIG. 21. For example, if a depth of five is desired (as illustrated in each column of FIG. 10 except for the first column), then capacitor assemblies 800, 803, and 805 would be segmented along dashed line 811 of FIG. 21, rotated ninety (90) degrees, then tipped into the page, so that in FIG. 23 each resulting capacitor group 820 would have five rows of capacitors into the page, each row having three capacitors visible.

Figure 24:
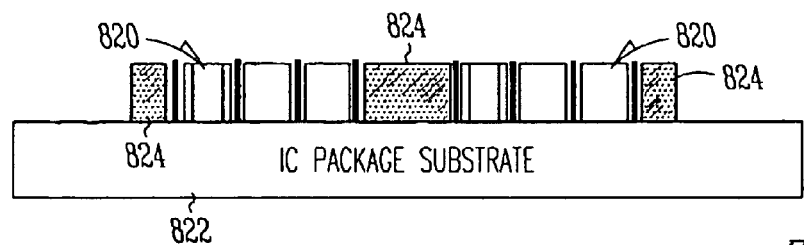

FIG. 24 illustrates filling spaces with a dielectric. Any spaces in and around capacitor groups 820 are next filled in with a suitable filler 824 such as a nonconductive epoxy. As noted elsewhere herein, it may be feasible to omit filler 824 if it is not needed to handle thermal and/or mechanical stress forces on the package.

Figure 25:
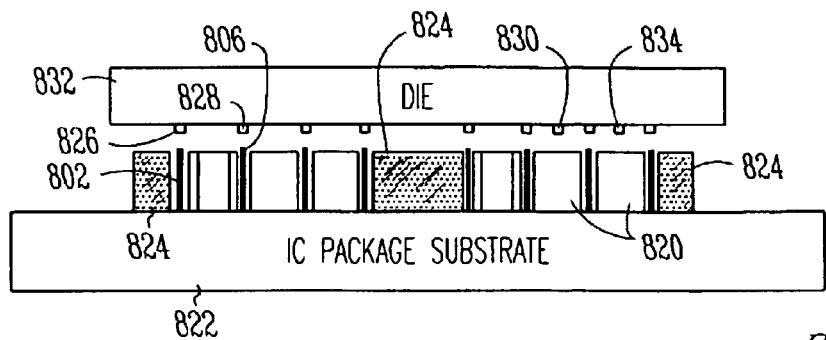

FIG. 25 illustrates mounting a die 832 on a capacitor layer of an IC package substrate 822. Die 832 can be similar to or identical to die 122 (FIG. 4) in that die 832 may comprise a plurality of terminals, such as terminals 830 and 834 to secure to corresponding terminals (not shown) of the capacitor groups 820. Die 832 may also comprise a plurality of terminals, such as terminals 826 and 828 to secure to respective ones of the bar-like conductors (e.g. conductive layers such as 802 and 806), for example, using solder or other electrically conductive adhesive or connector. It will be appreciated that the resulting structure that has been fabricated by this series of operations, culminating in the structure shown in FIG. 25, is similar, if not identical to, IC package 420 of FIG. 11.

Although, in FIGS. 11 and 14, capacitors have been illustrated as being mounted between conductive bars that have been formed on an IC package substrate, in other embodiments capacitors could be mounted between conductive bars that have been formed on a die. One manner of fabricating such an embodiment will now be described. The formation of one or more capacitor groups can be carried out in the same or similar manner as illustrated in FIGS. 20–22 and described above. Alternatively, one or more discrete capacitors could be used, such as from the capacitors shown in FIGS. 15–19.

Figure 26:
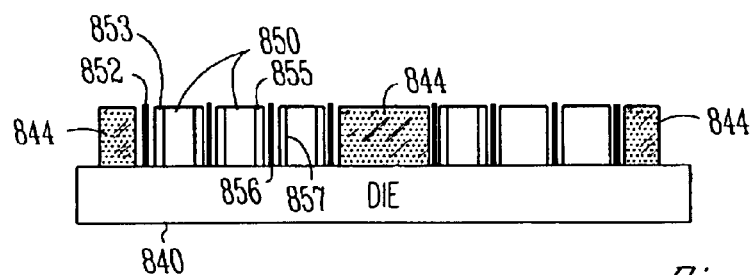
FIG. 26 illustrates a group of capacitors mounted on a die, in accordance with an embodiment of the invention.

FIG. 26 illustrates several capacitors or capacitor groups 850 mounted on a die 840, in accordance with an embodiment of the invention. Die 840 has terminals (not shown) on its upper surface. Some terminals (not shown) of die 840 are physically and electrically coupled to corresponding conductive bars, such as conductive bars 852 and 856.

Conductive bars 852 and 856 can be formed in any suitable manner. They could be formed in the same or similar manner as conductive layers 802, 804, 806, and 808 in the embodiment shown in FIG. 23. They could also be formed in any of various alternative ways, such as through a build-up of metallic conductors (e.g. copper or aluminum) on the die surface.

The conductive bars, in turn, are physically and electrically coupled to the side terminals of capacitors or capacitor groups 850. For example, conductive bar 852 is coupled to terminal 853, and conductive bar 856 is coupled to terminals 855 and 857.

In addition, other terminals (not shown) of die 840 may be coupled to corresponding terminals (not shown) on the lower surface of capacitors or capacitor groups 850 (e.g. if capacitors such as that shown in FIG. 19 are used).

The spaces in and around the capacitors or capacitor groups 850 can be filled with a dielectric 844 if necessary.

Figure 27:
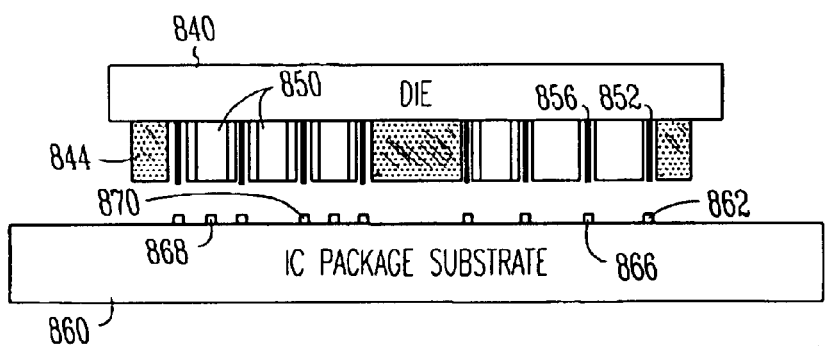
FIG. 27 illustrates mounting the die shown in FIG. 26 upon an IC package substrate.

FIG. 27 illustrates mounting the die 840 shown in FIG. 26 upon an IC package substrate 860. The die 840 shown in FIG. 26, along with its attached assembly of capacitors, is inverted and aligned with an IC mounting region on IC package substrate 860, so that terminals on the upper surface of IC package substrate 860, such as terminals 862 and 866, are aligned with corresponding conductive bars on the lower surface of die 840, such as conductive bars 852 and 856. In addition, other terminals on the upper surface of IC package substrate 860, such as terminals 868 and 870, are aligned with corresponding terminals (not shown) on the underside of capacitors or capacitor groups 850.

Figure 28A:
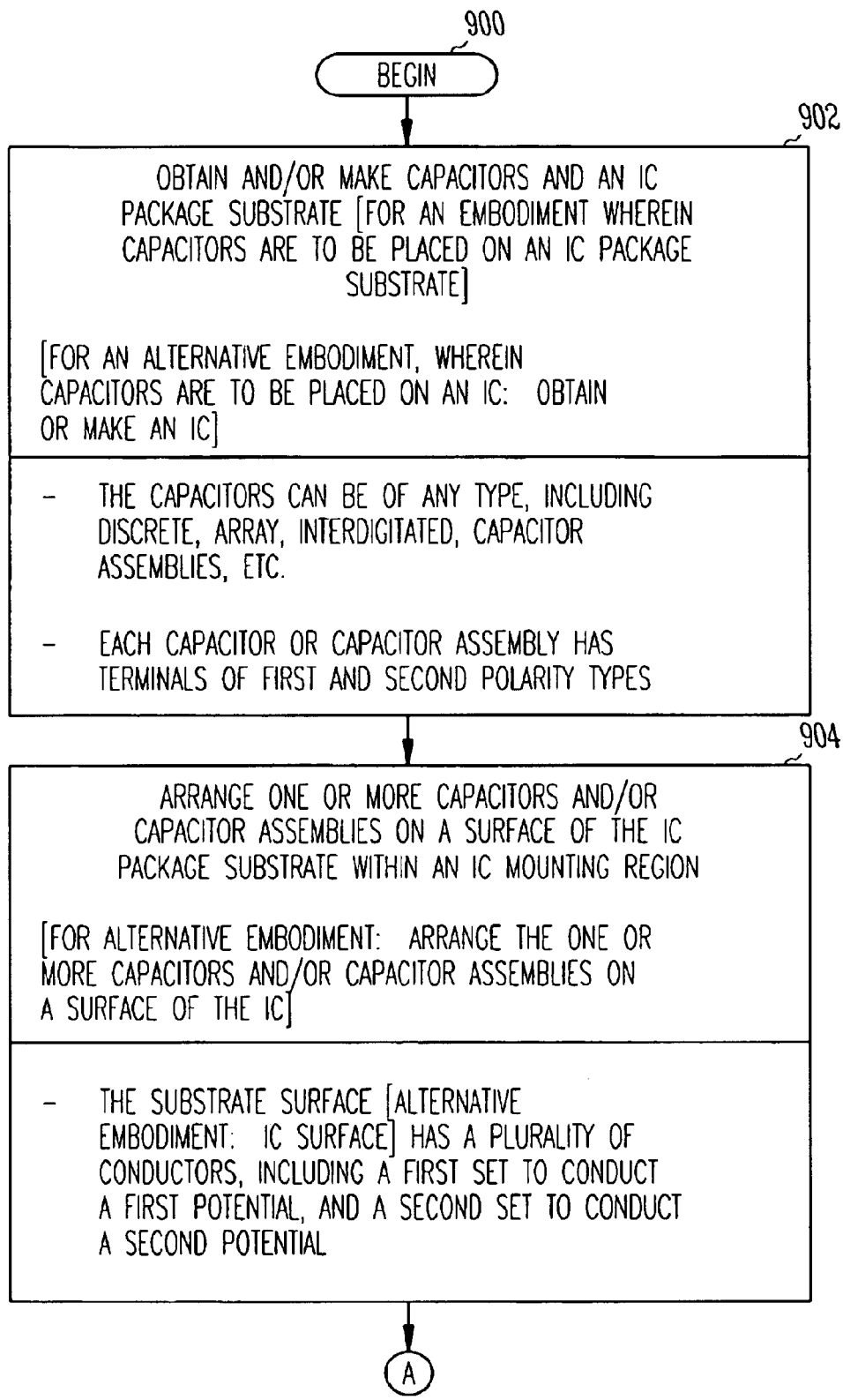
Figure 28C:
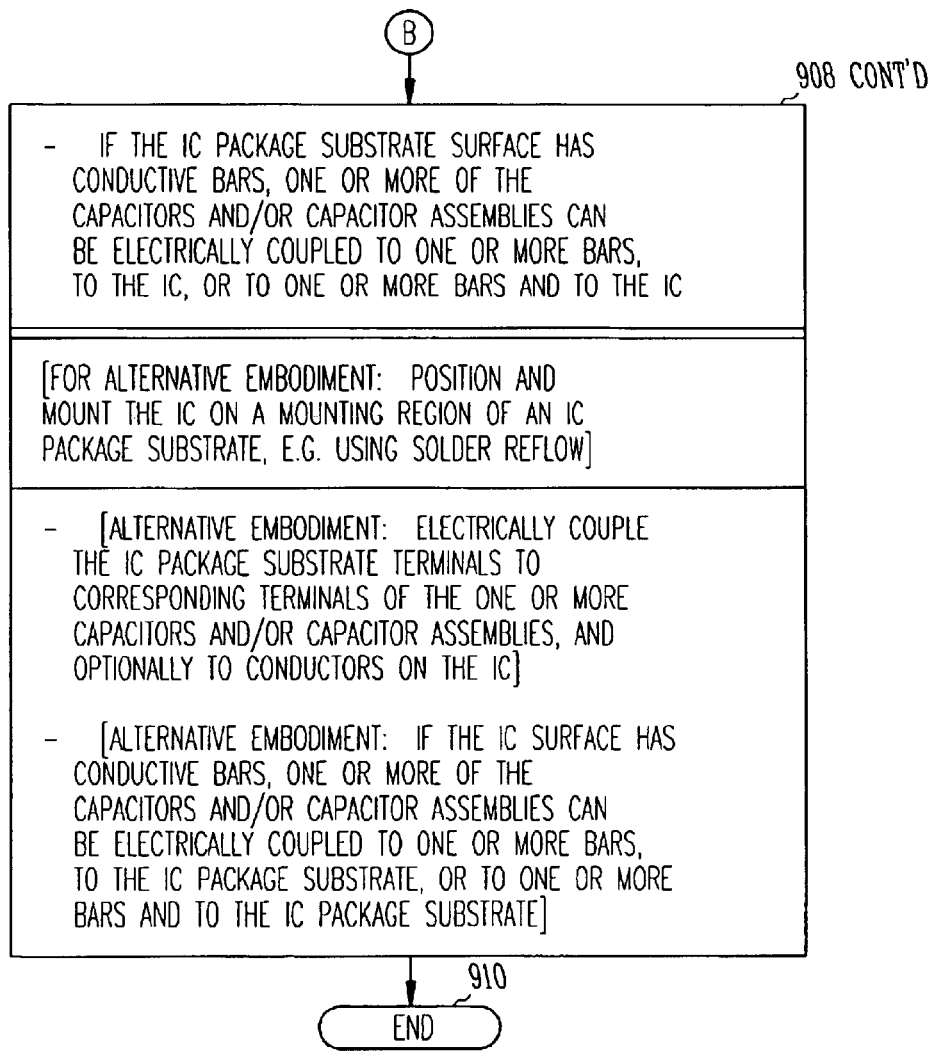

FIGS. 28A, 28B, and 28C together illustrate a flow diagram of various methods of fabricating electronic assemblies, and/or constituents thereof, utilizing sandwiched capacitors, in accordance with embodiments of the invention. The flow diagram combines several different method embodiments, including (1) a method of placing capacitors on an IC package substrate, (2) a method of placing capacitors on an IC (following wafer processing), and (3) a method of fabricating an IC package. These different methods all utilize sandwiched capacitors. The methods begin at 900.

In 902, suitable capacitors are either obtained (e.g. by procuring them from a capacitor supplier) or made. In addition, for an embodiment wherein capacitors are to be first placed on an IC package substrate, prior to an IC being mounted on the IC package substrate, a suitable IC package substrate is either obtained (e.g. by procuring it from a substrate supplier) or made. For an alternative embodiment wherein capacitors are to be first placed on an IC surface, prior to mounting the IC on an IC package substrate, a suitable IC is either obtained or made.

The capacitors can be of any suitable type, depending upon the IC, the IC package substrate, and the desired performance characteristics. For example, the capacitors can be discrete capacitors, capacitor arrays, multilayer ceramic capacitors, interdigitated capacitors, capacitor assemblies (e.g. like capacitor assembly 800 shown in FIG. 20), capacitor groups (e.g. like capacitor group 820 shown in FIG. 22), and the like. Each capacitor or capacitor assembly has terminals of first and second polarity types. The examples of capacitors shown in the figures are meant to be illustrative and not limiting.

In 904, one or more capacitors and/or capacitor assemblies are arranged on a surface of the IC package substrate within an IC mounting region. For the alternative embodiment, the one or more capacitors and/or capacitor assemblies are arranged on a surface of the IC.

The surface of the IC package substrate (or of the IC, for the alternative embodiment) has a plurality of terminals or conductors. A first set of conductors is to conduct a first potential (e.g. Vcc), and a second set of conductors is to conduct a second potential (e.g. ground). The conductors can be of any suitable type, geometry, and composition. For example, the conductors can be surface traces, mounting pads, conductive bars, and so forth. The one or more capacitors and/or capacitor assemblies are arranged such that certain terminals of the first polarity type contact the first set of conductors, and certain terminals of the second polarity type contact the second set of conductors. If the IC package substrate surface (or the IC surface, for the alternative embodiment) has conductive bars, one or more of the capacitors and/or capacitor assemblies can be positioned between adjacent ones of the bars.

In 906, the capacitors and/or capacitor assemblies are secured to the IC package substrate surface (or to the IC surface, for the alternative embodiment) using a suitable mechanism. For example, the capacitors and/or capacitor assemblies are soldered to the substrate surface (or to the IC surface, for the alternative embodiment). A fill can be applied to the capacitors and/or capacitor assemblies, and/or to openings between the capacitors and/or capacitor assemblies. In addition, or alternatively, suitable spacers and/or clamps could be used to secure the capacitors and/or capacitor assemblies to the substrate surface (or to the IC surface, for the alternative embodiment).

In 908, an IC (e.g. die 120 of FIG. 4) is positioned relative to the IC mounting region, and it is mounted on the mounting region using, for example, solder in a solder reflow operation. Alternatively, the IC could be mounted on the IC mounting region using any other suitable mechanism, such as flexible connectors. During 908, the IC terminals are electrically coupled to corresponding terminals of the one or more capacitors and/or capacitor assemblies. In addition, or alternatively, the IC terminals could be electrically coupled to corresponding conductors on the substrate. If the IC package substrate surface has conductive bars, one or more of the capacitors and/or capacitor assemblies can be electrically coupled to one or more conductive bars, or to the IC, or to one or more conductive bars and to the IC.

For the alternative embodiment, the IC bearing the one or more capacitors and/or capacitor assemblies is positioned relative to an IC mounting region of an IC package substrate, and the IC is mounted on the mounting region using, for example, solder in a solder reflow operation. Alternatively, the IC could be mounted on the IC mounting region using any other suitable mechanism, such as flexible connectors or an interposer. During 908, the IC package substrate terminals are electrically coupled to corresponding terminals of the one or more capacitors and/or capacitor assemblies. In addition, or alternatively, the IC package substrate terminals could be electrically coupled to corresponding conductors on the IC. If the IC surface has conductive bars, one or more of the capacitors and/or capacitor assemblies can be electrically coupled to one or more conductive bars, or to the IC package substrate, or to one or more conductive bars and to the IC package substrate. In 910, the methods end.

Figure 29A:
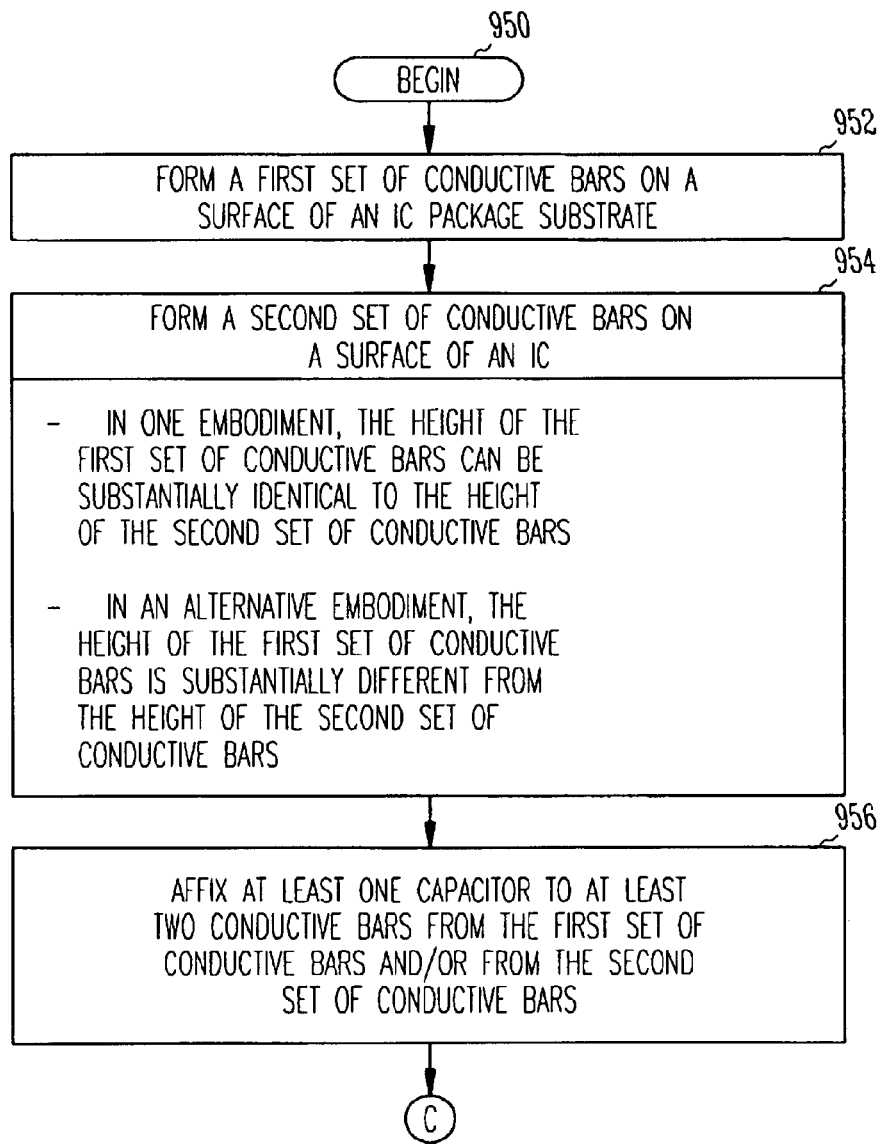
FIGS. 29A and 29B together illustrate a flow diagram of various additional methods of fabricating electronic assemblies, and/or constituents thereof, utilizing sandwiched capacitors, in accordance with embodiments of the invention.
Figure 29B:
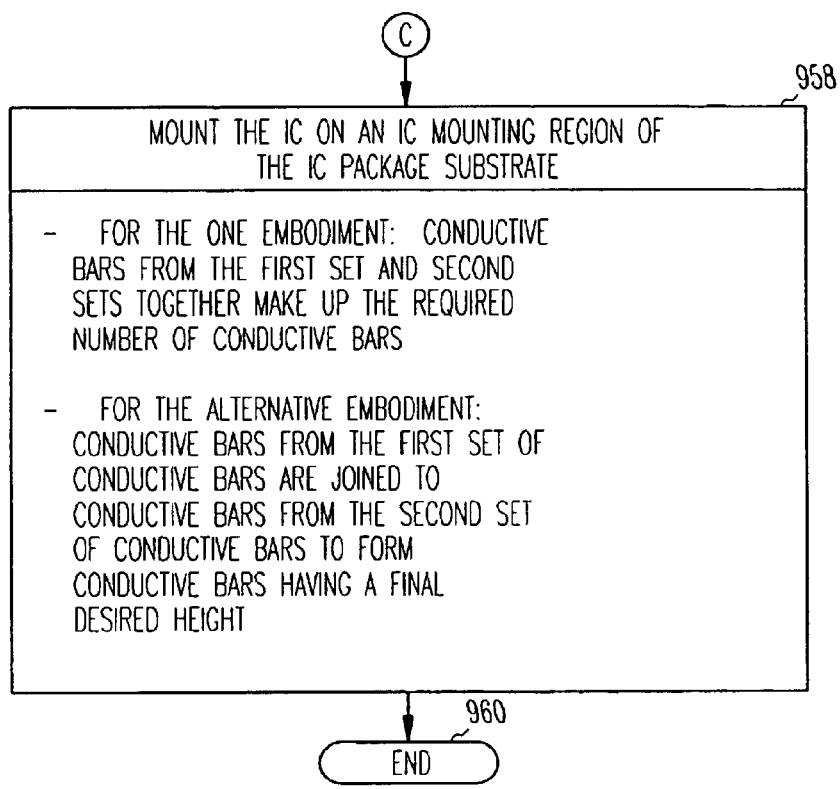

FIGS. 29A and 29B together illustrate a flow diagram of various additional methods of fabricating electronic assemblies, and/or constituents thereof, utilizing sandwiched capacitors, in accordance with embodiments of the invention. The flow diagram of FIGS. 29A and 29B illustrates two different ways of forming conductive bars for the package.

In one embodiment, some full-height conductive bars are fabricated on a surface of an IC package substrate, and some additional full-height conductive bars are fabricated on a surface of an IC. When the IC is mounted on the IC package substrate, the bars formed on the IC package substrate and the bars formed on the IC together make up the required number of conductive bars.

In an alternative embodiment, conductive bars of ½ (or other suitable fraction) of the final desired height are fabricated on the IC package substrate, and conductive bars of ½, or such suitable fraction to add up to the final height, are fabricated on the IC. When the IC is mounted on the IC package substrate, bars from the IC package substrate and from the IC are suitably joined together to form bars having a final desired height.

These two embodiments will now be described with reference to the flow diagram of FIGS. 29A and 29B. The method begins at 950.

In 952, a first set of conductive bars is formed on a surface of an IC package substrate.

In 954, a second set of conductive bars is formed on a surface of an IC. In the first embodiment, described above, the height of the first set of conductive bars can be substantially identical to the height of the second set of conductive bars. For the second embodiment, described above, the height of the first set of conductive bars is substantially different from the height of the second set of conductive bars; it is not necessary that all bars on the IC or on the IC package substrate have equal height, so long as any two bars to be joined have the correct total height between the two of them.

In 956, at least one capacitor is affixed to at least two conductive bars from the first set of conductive bars and/or from the second set of conductive bars. Typically, as illustrated in FIGS. 10–14, many capacitors are affixed to conductive bars from the first and/or second sets of conductive bars.

In 958, the IC is mounted on an IC mounting region of the IC package substrate. For the first embodiment, conductive bars from the first and second sets together make up the required number of conductive bars. If, in 956, capacitors have been affixed to conductive bars from both the first and second sets of bars, they should be appropriately offset or staggered so that the die and the IC package substrate fit together properly.

For the second embodiment, conductive bars from the first and second sets of bars are joined together to form bars having a final desired height. It is unnecessary that all bars on the IC or on the IC package substrate have the same height, so long as mating bars from the IC and IC package substrate together form a finished bar having a final desired height. The bars are joined together using any suitable mechanism, such as solder. The method ends at 960.

The operations described above with respect to the methods illustrated in FIGS. 28A–C and 29A–B can be performed in a different order from those described herein.

The above-described and illustrated details relating to the number, arrangement, dimensions, and types of capacitors, the ICs, the IC package substrates, and other constituent parts are merely exemplary of the embodiments illustrated, and they are not meant to be limiting. Further, the assembly operations and sequencing can be varied by one of ordinary skill in the art to optimize the fabrication and performance of the package.

FIGS. 1–27 are merely representational and are not drawn to scale. Certain proportions thereof may be exaggerated, while others may be minimized. FIGS. 1–29 are intended to illustrate various implementations of the invention that can be understood and appropriately carried out by those of ordinary skill in the art.

The present invention provides for an IC package and methods of manufacture thereof that minimize problems associated with high power delivery, such as high inductance between the IC and bypass capacitors of the DSC, LSC, or ECC type. Depending upon the specific layout, including the number and type(s) of capacitors, a total package inductance of approximately 1 pico-Henry (pH) should be achievable, compared with current inductance values of several pHs for packages using DSC, LSC, and/or ECC bypass capacitors.

In addition to lowering inductance, the present invention provides a lower resistance path between the power conductors on the IC package substrate and the IC, thereby substantially improving power delivery. Voltage drop attributable to current path resistance (i.e., I*R) is lessened, and a higher maximum current Imax is achieved on the IC.

By substantially lowering inductance, increasing current delivery, and improving CTE compatibility between the die and the package substrate, the present invention allows electronic assemblies with high performance ICs to be operated at increased clock frequencies and with higher reliability.

An electronic assembly and/or electronic system that incorporates one or more electronic IC packages that utilize the present invention can handle the relatively high power densities and clock frequencies associated with high performance ICs, and such systems are therefore more commercially attractive.

As shown herein, the present invention can be implemented in a number of different embodiments, including a substrate, an integrated circuit package, an electronic assembly, an electronic system in the form of a data processing system, and various methods of fabricating a substrate and an IC package. Other embodiments will be readily apparent to those of ordinary skill in the art. The elements, materials, geometries, dimensions, and sequence of operations can all be varied to suit particular manufacturing and packaging requirements.

Although in certain embodiments, the terminals of a given element in the electronic package have been described as being both physically and electrically coupled to terminals of other elements, the term "physically" should not be construed as limiting, particularly in other embodiments wherein the terminals are coupled by an interposer or other electrical connector that precludes direct physical contact between such terminals.

While certain operations have been described herein relative to "upper" or "above", or to "lower" or "below", it will be understood that these descriptors are relative, and that they would be reversed if the substrate or package were inverted. Therefore, these terms are not intended to be limiting.

Although the present invention deals primarily with capacitors that are interposed between an IC and an IC package substrate, some mention should be made concerning how to couple I/O terminals on the IC with corresponding conductors on the IC package substrate. These connections can be of any suitable type. For example, metal conductors could be held in place between the die and the IC package substrate with insulating spacers. In the embodiment of FIG. 9, the capacitor array could be modified to include via-like conductors between the IC I/O terminals and the IC package substrate I/O terminals. Other types of I/O connectors can be employed by those of ordinary skill in the art.

The present invention is not to be construed as limited to use in C4 packages, and it can be used with any other type of IC package where the herein-described features of the present invention provide an advantage.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit (IC) package comprising:
    a substrate having a plurality of conductors within an IC mounting region, wherein the conductors include at least a first conductive bar having a height and a width, the height exceeding the width;
    a plurality of capacitors distributed substantially throughout the IC mounting region and electrically coupled to the first conductive bar, wherein the plurality of capacitors comprises a plurality of capacitor arrays; and
    an IC electrically coupled to the plurality of conductors via the plurality of capacitors.

2. The IC package recited in claim 1, wherein selected ones of the plurality of capacitors are further electrically coupled to a second conductive bar of the plurality of conductors, wherein the first conductive bar is to couple to a first potential, and wherein the second conductive bar is to couple to a second potential.

3. The IC package recited in claim 1, wherein each of the plurality of capacitors has a top and a bottom, and wherein selected ones of the plurality of capacitors have at least one terminal on their top and at least one terminal on their bottom.

4. The IC package recited in claim 1, wherein each of the capacitor arrays has a top and a bottom, and wherein selected ones of the capacitor arrays have a plurality of terminals of first and second polarities on their top and a plurality of terminals of first and second polarities on their bottom.

5. The IC package recited in claim 1, wherein selected ones of the plurality of capacitor arrays are interdigitated capacitors.

6. An integrated circuit (IC) package comprising:
a substrate having a plurality of conductors within an IC mounting region, wherein the conductors include at least a first conductive bar having a height and a width, the height exceeding the width;
at least one capacitor within the IC mounting region and electrically coupled to the first conductive bar, wherein the at least one capacitor is mounted atop the first conductive bar; and
an IC electrically coupled to the plurality of conductors via the at least one capacitor.

7. The IC package recited in claim 6, wherein the at least one capacitor is further electrically coupled to a second conductive bar of the plurality of conductors, wherein the first conductive bar is to couple to a first potential, and wherein the second conductive bar is to couple to a second potential.

8. The IC package recited in claim 6, wherein the at least one capacitor has a top and a bottom, and wherein the at least one capacitor has terminals on its top and bottom.

9. The IC package recited in claim 6 and comprising a plurality of capacitors distributed substantially throughout the IC mounting region, each capacitor being in electrical contact with at least one of the conductors.

10. The IC package recited in claim 9, wherein the plurality of capacitors comprises a plurality of sets of capacitors, each set comprising two or more capacitors having ends and being aligned substantially end-to-end.

11. An integrated circuit (IC) package comprising:
a substrate having a plurality of conductors within an IC mounting region, wherein the plurality of conductors are substantially parallel to one another, and wherein the plurality of conductors include at least a first conductive bar having a height and a width, the height exceeding the width;
a plurality of capacitors within the IC mounting region and electrically coupled to the first conductive bar, wherein the plurality of capacitors comprises a plurality of capacitor arrays; and
an IC electrically coupled to the plurality of conductors via the plurality of capacitors.

12. The IC package recited in claim 11, wherein selected ones of the plurality of capacitors are further electrically coupled to a second conductive bar of the plurality of conductors, wherein the first conductive bar is to couple to a first potential, and wherein the second conductive bar is to couple to a second potential.

13. The IC package recited in claim 11, wherein each of the plurality of capacitors has a top and a bottom, and wherein selected ones of the plurality of capacitors have at least one terminal on their top and at least one terminal on their bottom.

14. The IC package recited in claim 11, wherein each of the capacitor arrays has a top and a bottom, and wherein selected ones of the capacitor arrays have a plurality of terminals of first and second polarities on their top and a plurality of terminals of first and second polarities on their bottom.

15. The IC package recited in claim 11, wherein the plurality of capacitor arrays are non-orthogonally mounted atop the plurality of conductors.

16. The IC package recited in claim 15, wherein the conductors are diagonal to the plurality of capacitor arrays.

17. An integrated circuit (IC) package comprising:
a substrate having a plurality of conductors within an IC mounting region, wherein the plurality of conductors include at least a first conductive bar having a height and a width, the height exceeding the width;
a capacitor array within the IC mounting region and electrically coupled to the first conductive bar; and
an IC electrically coupled to the plurality of conductors via the capacitor array.

18. The IC package recited in claim 17, wherein the capacitor array is further electrically coupled to a second conductive bar of the plurality of conductors, wherein the first conductive bar is to couple to a first potential, and wherein the second conductive bar is to couple to a second potential.

19. The IC package recited in claim 18, wherein the at least first and second conductive bars have a gap to accommodate the capacitor array.

20. The IC package recited in claim 17, wherein the capacitor array is non-orthogonally mounted atop the plurality of conductors.

21. The IC package recited in claim 17, wherein the capacitor array has a top and a bottom, and wherein the capacitor array has at least one terminal on its top and at least one terminal on its bottom.

22. The IC package recited in claim 21, wherein the capacitor array has a plurality of terminals of first and second polarities on its top and a plurality of terminals of first and second polarities on its bottom.

23. An integrated circuit (IC) package comprising:
a substrate having a plurality of conductors within an IC mounting region, wherein the conductors include at least one conductive bar having a height and a width, the height exceeding the width;
a plurality of capacitors within the IC mounting region, wherein the plurality of capacitors are mounted beside and in electrical contact with the at least one conductive bar; and
an IC electrically coupled to the plurality of conductors via the plurality of capacitors.

24. The IC package recited in claim 23, wherein the plurality of conductors comprises at least first and second conductive bars, wherein the first conductive bar is to couple to a first potential, and wherein the second conductive bar is to couple to a second potential.

25. The IC package recited in claim 23, wherein selected ones of the plurality of capacitors have a first side and a second side, wherein the first side comprises at least one terminal of first polarity, and wherein the second side comprises at least one terminal of second polarity.

26. The IC package recited in claim 23, wherein selected ones of the plurality of capacitors are mounted beside one of the plurality of conductors.

27. The IC package recited in claim 23, wherein selected ones of the plurality of capacitors are mounted between two of the plurality of conductors.

28. The IC package recited in claim 23, wherein the at least one conductive bar has a length, and wherein at least one of the plurality of capacitors has a length substantially the same as the length of the at least one conductive bar.

29. The IC package recited in claim 23, wherein the plurality of conductors comprises at least first and second conductive bars having a height and a width, the height exceeding the width, wherein the first conductive bar is to couple to a first potential, wherein the second conductive bar is to couple to a second potential, wherein the first and second conductive bars have a length, wherein at least one of the plurality of capacitors has a length substantially the same as the length of the first and second conductive bars and is mounted beside and in electrical contact with the first and second conductive bars, wherein at least another of the plurality of capacitors is a capacitor array, and wherein the at least first and second conductive bars have a gap to accommodate the capacitor array.

30. The IC package recited in claim 29, wherein the capacitor array has a top and a bottom, wherein the capacitor array has at least one terminal on its top and at least one terminal on its bottom, and wherein the at least one terminal on its bottom is coupled to one of the first and second conductive bars.

31. The IC package recited in claim 29, wherein the capacitor array is transverse to the at least one capacitor.

32. An integrated circuit (IC) package comprising:
a substrate having a plurality of conductive bars within an IC mounting region, the conductive bars having a height and a width, the height exceeding the width;
a plurality of capacitors within the IC mounting region, wherein the plurality of capacitors are mounted beside and in electrical contact with selected ones of the conductive bars; and
an IC electrically coupled to the plurality of conductive bars via the plurality of capacitors.

33. The IC package recited in claim 32, wherein selected ones of the plurality of capacitors have a first side and a second side, wherein the first side comprises at least one terminal of first polarity, and wherein the second side comprises at least one terminal of second polarity.

34. The IC package recited in claim 33, wherein the IC comprises a plurality of pads of first and second polarities, wherein the selected ones of the plurality of capacitors have a top and a bottom, wherein at least one terminal on the top is of a first polarity, wherein at least one terminal on the top is of a second polarity, wherein the at least one terminal of first polarity is coupled to at least one corresponding pad of first polarity, and wherein the at least one terminal of second polarity is coupled to at least one corresponding pad of second polarity.

35. An integrated circuit (IC) package comprising:
a substrate having a plurality of conductors within an IC mounting region, wherein the conductors include at least one conductive bar having a height and a width, the height exceeding the width;
at least one capacitor within the IC mounting region, wherein the at least one capacitor is mounted beside and in electrical contact with the at least one conductive bar; and
an IC electrically coupled to the plurality of conductors.

36. The IC package recited in claim 35, wherein the at least one capacitor is mounted between and electrically coupled to first and second conductive bars.

37. The IC package recited in claim 36, wherein the first conductive bar is to couple to a first potential, and wherein the second conductive bar is to couple to a second potential.

38. The IC package recited in claim 36, wherein the capacitor comprises terminals on two sides, and wherein the terminals are electrically coupled to the first and second conductive bars, respectively.

39. The IC package recited in claim 35, wherein the plurality of conductors are substantially parallel to one another.

40. An integrated circuit (IC) package comprising:
a substrate having a plurality of conductors within an IC mounting region, wherein the plurality of conductors are substantially parallel to one another;
a plurality of capacitors within the IC mounting region and electrically coupled to at least one of the conductors, wherein the plurality of capacitors comprises a plurality of capacitor arrays, and wherein the plurality of capacitor arrays are non-orthogonally mounted atop the plurality of conductors; and
an IC electrically coupled to the plurality of conductors via the plurality of capacitors.

41. The IC package recited in claim 40, wherein the plurality of conductors are substantially parallel to one another.

42. The IC package recited in claim 40, wherein the plurality of conductors are diagonal to the plurality of capacitor arrays.

* * * * *